(12) United States Patent
Howard et al.

(10) Patent No.: US 10,039,209 B1
(45) Date of Patent: Jul. 31, 2018

(54) STRUCTURE FOR TRANSFERRING HEAT IN DEVICES

(71) Applicant: AMAZON TECHNOLOGIES, INC., Seattle, WA (US)

(72) Inventors: John Avery Howard, Palo Alto, CA (US); David Eric Peters, San Jose, CA (US); Ross Kenneth Thayer, Santa Clara, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/188,670

(22) Filed: Jun. 21, 2016

Related U.S. Application Data

(63) Continuation of application No. 13/718,661, filed on Dec. 18, 2012, now Pat. No. 9,414,530.

(51) Int. Cl.
| H05K 7/20 | (2006.01) |
| H01L 23/367 | (2006.01) |
| H05K 1/02 | (2006.01) |
| H01L 23/373 | (2006.01) |

(52) U.S. Cl.
CPC ..... *H05K 7/20481* (2013.01); *H05K 7/20518* (2013.01); *H01L 23/367* (2013.01); *H01L 23/373* (2013.01); *H05K 1/0204* (2013.01)

(58) Field of Classification Search
CPC ............ H05K 7/2039; H05K 7/20472; H05K 7/20481; H05K 7/205; H05K 7/20518; H05K 7/20963; H05K 1/0207; H05K 1/0209; H05K 1/0204; H05K 1/0206; G06F 1/20

USPC ........................ 361/679.46–679.54, 688–723
See application file for complete search history.

(56) References Cited

U.S. PATENT DOCUMENTS

| 7,161,809 B2 | 1/2007 | Ford et al. |
| 7,228,894 B2 * | 6/2007 | Moore .................... H01L 23/36 165/185 |
| 7,352,584 B1 | 4/2008 | Sung |
| 7,576,988 B2 | 8/2009 | Schwarz |
| 8,570,747 B2 | 10/2013 | Cheng et al. |
| 8,681,502 B2 * | 3/2014 | Wu .................... B29C 45/14311 165/80.3 |
| 8,804,331 B2 | 8/2014 | Refai-Ahmed |
| 9,301,429 B2 * | 3/2016 | Zhang .................. H01L 23/373 |
| 2005/0190541 A1 | 9/2005 | Yang et al. |
| 2005/0270746 A1 * | 12/2005 | Reis ........................ G06F 1/203 361/708 |
| 2007/0263352 A1 | 11/2007 | Jones et al. |

(Continued)

OTHER PUBLICATIONS

Pape, Zachary, "Non-Final Office Action dated Nov. 17, 2015", U.S. Appl. No. 13/718,661, The United States Patent and Trademark Office, dated Nov. 17, 2015.

(Continued)

*Primary Examiner* — Zachary M Pape
(74) *Attorney, Agent, or Firm* — Lindauer Law, PLLC

(57) ABSTRACT

Described are techniques for controlling the transfer of heat on various portions of a device or other structure. A structure may include a substrate having a first thermal conductivity. A material having a different thermal conductivity is distributed on the substrate. The position, quantity, and thickness of the material affects the manner in which heat is transferred away from at least one hot spot on the substrate.

20 Claims, 18 Drawing Sheets

(56) References Cited

U.S. PATENT DOCUMENTS

| | | |
|---|---|---|
| 2011/0090631 A1 | 4/2011 | Atkinson |
| 2013/0188318 A1 | 7/2013 | I et al. |
| 2014/0098489 A1 | 4/2014 | Chiriac et al. |
| 2014/0118928 A1 | 5/2014 | Cheng |

OTHER PUBLICATIONS

Pape, Zachary, "Final Office Action dated Jul. 14, 2015", U.S. Appl. No. 13/718,661, The United States Patent and Trademark Office, dated Jul. 14, 2015.

Pape, Zachary, "Non-Final Office Action dated Mar. 24, 2015", U.S. Appl. No. 13/718,661, The United States Patent and Trademark Office, dated Mar. 24, 2015.

Pape, Zachary, "Notice of Allowance dated Mar. 28, 2016", U.S. Appl. No. 13/718,661, The United States Patent and Trademark Office, dated Mar. 28, 2016.

* cited by examiner

STRUCTURE FOR TRANSFERRING HEAT IN DEVICES

PRIORITY

This application is a continuation of, and claims priority to, pending U.S. patent application Ser. No. 13/718,661 filed on Dec. 18, 2012, entitled "Altering Thermal Conductivity in Devices". The entirety of this previously filed application is hereby incorporated by reference.

BACKGROUND

With the increasing popularity of mobile devices, device manufacturers have sought ways to create devices with more processing power and other capabilities in a smaller size. In many cases, increasing the processing power of a device through the use of more powerful processors or adding other components may lead to an increase in heat generated by those components inside the device. Also the decreasing size of a device may inhibit the device's ability to dissipate heat. Accordingly, smaller and more powerful devices may be more prone to localized extreme temperatures. For example, a hot spot may develop which is uncomfortable to a user or which may result in damage to the component.

Certain implementations and embodiments will now be described more fully below with reference to the accompanying figures, in which various aspects are shown. However, various aspects may be implemented in many different forms and should not be construed as limited to the implementations set forth herein. Like numbers refer to like elements throughout.

DETAILED DESCRIPTION

This disclosure describes implementations of features to vary the thermal conductivity of one or more structures of a device to provide for a more uniform distribution of heat across the one or more structures. Implementations include surface features for interior or exterior surfaces of one or more walls of a device. Implementations also include features for an intermediate layer of a wall that is situated between an exterior and an interior surface of the wall. The features described herein may vary the thermal conductivity transversely along a plane that is parallel to a primary plane described by the overall length and width of the wall. These features facilitate the conduction of heat away from hot spots caused by operation of heat generating components. By conducting heat transversely away from hot spots, hot spots in the device wall may be reduced in intensity or number, thus reducing the likelihood of an adverse user experience that may result from such hot spots.

Figure 1:
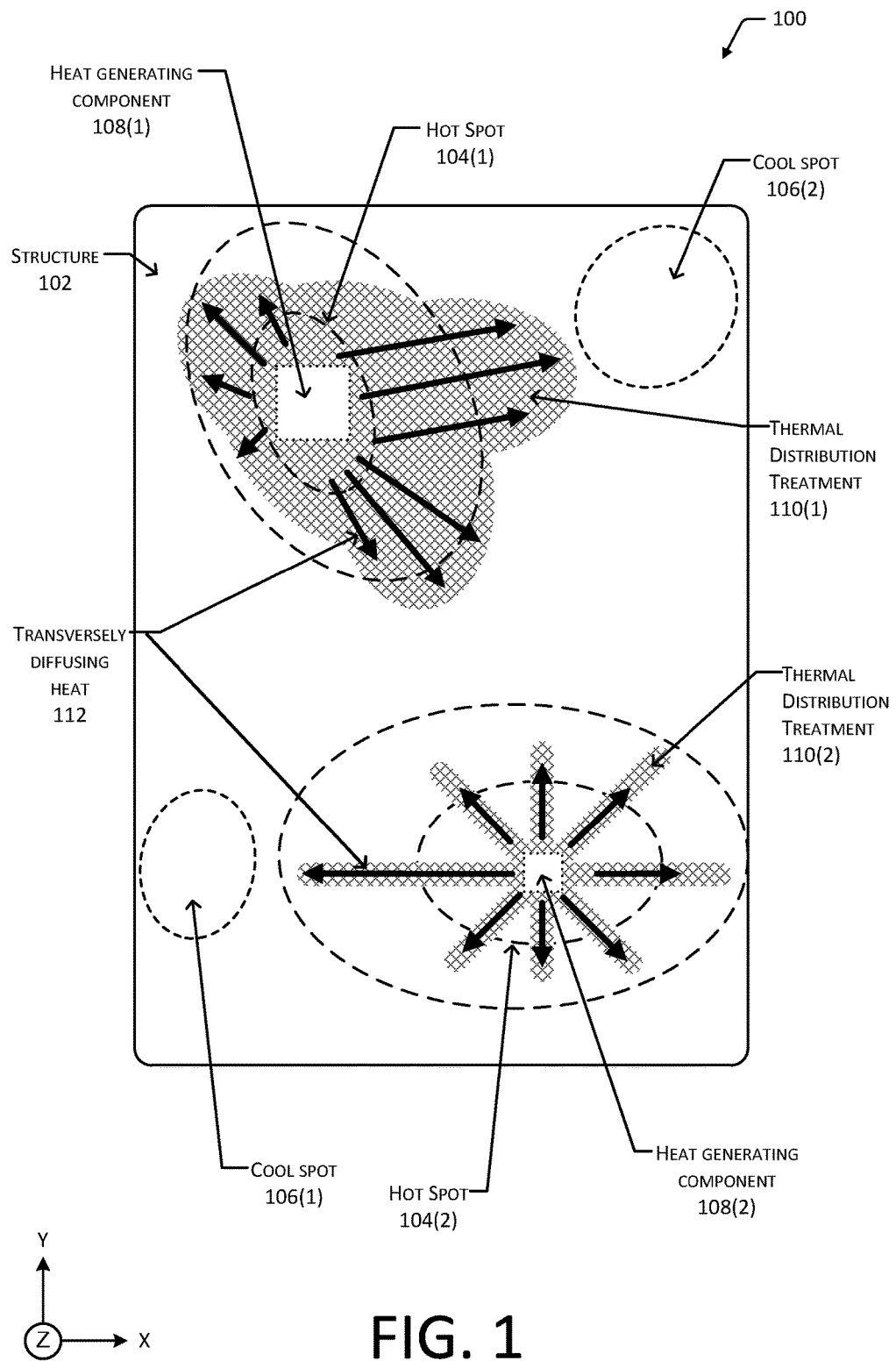
FIG. 1 depicts an example thermal distribution in a structure of a device, exhibiting one or more hot spots and one or more thermal distribution treatments to dissipate heat from the hot spots.

FIG. 1 depicts an example thermal distribution 100 as a plan view of a structure 102 of a device. The structure 102 is depicted from outside the device which presents a broad side of the device, such as the back plate or case of the device. As used herein, the structure 102 may include a portion of the device such as one or more interior surfaces (e.g., at least partly enclosed by the case), one or more exterior surfaces, or both interior and exterior surfaces. The structure 102 may be substantially flat, or may be at least partly curvilinear.

The thermal distribution 100 includes isothermic curves, where each curve connects points of equal temperature and where each curve represents a different temperature. In the example shown, the structure 102 exhibits one or more temperature maxima such as hot spots 104(1) and 104(2). Also shown are one or more temperature minima such as cool spots 106(1) and 106(2). As used herein, the term hot spot 104 refers to points, areas, or portions of a surface that have a higher temperature than a predetermined threshold value. In some implementations, the predetermined threshold value is an average temperature of the surface or a certain percentage of the average temperature (e.g., 110% of the average temperature). Such hot spots may feel hot to the touch of a user of the device, or appear hot when the device is thermally imaged using an infrared imaging system. The hot spots 104 may be areas of maximum temperature across the surface, or may be local maxima relative to a nearby portion of the surface. As used herein, cool spots 106 refer to points, areas, or portions of a surface that have a temperature lower than a predetermined threshold value, such as the average temperature of the surface. Although the structure 102 is shown having two hot spots and two cool spots, implementations support a structure exhibiting any number of hot spots 104 or cool spots 106.

The hot spots 104 may be caused by operation of heat generating device components. Devices may include one or more electrical components such as processors, central processing units (CPUs), graphics processing units (GPUs), memory, light emitting diodes, power handling circuitry, and so forth that generate heat during their operation. In some cases, the surface of a device may have hot spots 104 in one or more portions of the surface in proximity to, or otherwise correlated with, the location(s) of heat-generating electrical component(s) 108 within the device. In the example shown in FIG. 1, the hot spot 104(1) is correlated with a location of a heat generating component 108(1), and the hot spot 104(2) is correlated with a location of a heat generating component 108(2).

For commercially available devices that have outer walls made of a plastic, external hot spot temperatures may reach 50° Celsius (C) and may exceed a comfortable temperature for a user. For devices that have outer walls made of aluminum or some other metal, external hot spot temperatures may reach 40-45° C. This hot spot temperature may also exceed a comfortable temperature for a user, given that a metal wall has a higher thermal conductivity than plastic, and may conduct heat more efficiently into a user's skin when the user is holding the device. Accordingly, the hot spot temperatures of a plastic-walled or metal-walled device may create discomfort for a user using the device, and in certain extreme cases may even lead to burns when the device is used for a prolonged period of time. Implementations described herein vary the thermal conductivity of one or more structures of a device, such as surfaces or layers of a wall of a device, through the use of features such as the one or more thermal distribution treatments 110.

Implementations may employ any number of features to facilitate heat conduction. In some implementations, a feature may include a treatment of the structure 102. As used herein, a treatment may include one or more materials arranged on a surface of the structure 102 as a layer or coating of any thickness. A treatment may also include one or more materials incorporated into the material of the structure 102, such as a treatment that is interposed as an intermediate layer between other portions of the structure 102. The treatments described herein may be added to the structure 102 during or after manufacture of the structure 102, or may be part of an initial composition of the structure 102. Implementations support a treatment 110 that is at least partly radially symmetric, such as one or more of a star-shaped pattern, an elliptical pattern such as a circular pattern, and so forth. Implementations also support a treatment 110 that is at least partly symmetric about one or more axes, such as one or more of a polygonal pattern such as a rectangular pattern, a stripe pattern, and so forth. Implementations also support a treatment 110 that is substantially asymmetric.

FIG. 1 shows a thermal distribution treatment ("treatments") 110(1) to distribute heat from the hot spot 104(1), and a thermal distribution treatment 110(2) to distribute heat from the hot spot 104(2). The thermal distribution treatments 110(1) and 110(2) provide a variation in the thermal conductivity of the structure 102, and enable the structure 102 to conduct heat in a predetermined transverse direction. The thermal distribution treatments 110 may comprise materials arranged in a particular pattern and configured to direct the flow of heat. As shown in FIG. 1, the thermal distribution treatments 110(1) and 110(2) enable conduction of the transversely diffusing heat 112 transversely (e.g., in an x-y plane of the structure 102) away from the hot spots 104(1) and 104(2) toward the cool spots 106(1) and 106(2). In this way, the thermal distribution treatments 110(1) and 110(2) enable a particular distribution of heat in the x-y plane, and thus a predetermined distribution of heat that is conducted outward (e.g., along a z-axis) by the structure 102 and away from the device.

By using the thermal distribution treatments 110 a particular heat distribution across an outer surface or other structure of the device is provided. This may include reduction in the temperature of one or more hot spots on the outer surface or other structure of the device, thus providing a more comfortable user experience.

The thermal distribution treatments 110 may comprise a substance that is a thermal conductor or a thermal insulator. In some implementations, the treatment 110 may employ multiple substances of various thermal conductivities, or a composite of more than one substance. Implementations support any thermally conducting substance, including but not limited to: metals, such as aluminum, nickel, copper, and so forth; thermally conductive inks; or various carbon allotropes such as graphene. Implementations support any thermally insulating substance, including but not limited to: metal oxides, such as aluminum oxide; plastics; aerogels; ceramics; silicates, or various polymers such as polytetrafluoroethylene.

In some implementations, the treatment 110 may include one or more layers on an interior surface of a structure of the device. The treatment 110 may include a pattern of a thermally conductive substance on the interior surface of the structure 102. The structure 102 may have a lower thermal conductivity than material in the treatment 110 such that the structure 102 may be considered a thermal insulator. For example, a pattern of a thermally conductive metallic substance may be imposed on the interior surface of a plastic wall of the device case, the plastic being a thermal insulator. In some implementations, a thermally conductive pattern may be imposed on a thermally insulating layer or substrate that is in contact with the interior surface of the structure.

In some implementations, the treatment 110 may include one or more layers on an exterior surface of the structure 102 of the device. The treatment 110 may include a pattern of a thermally insulating substance on the exterior surface of the structure 102, where the structure 102 has a higher thermal conductivity than the material of the pattern such that the structure 102 may be considered a thermal conductor. For example, a pattern of a thermally insulating substance may be imposed on the exterior surface of a metallic, thermally conductive wall of the device. In some implementations, a thermally insulating pattern may be imposed on an intermediate layer or substrate that is in contact with the exterior surface of the structure.

In some implementations, the structure 102 of the device may include an exterior layer and an interior layer, and the treatment may include one or more intermediate layers that are situated at a z-level between the exterior layer and the interior layer of the structure. For example, the structure 102 may include exterior and interior layers of a thermal insulator with an intermediate layer of a thermal conductor in between. In some cases, a thermally conductive via or thermal conduit may thermally couple the conducting intermediate layer with a heat generating component 108 of the device, such as a processor.

The treatment 110 may be varied to produce particular heat distribution patterns. Thickness of the treatment 110 may be varied to achieve a varying thermal conductivity across the surface or treatment layer. Composition of the surface treatment 110 or layer may be varied to achieve a varying thermal conductivity across the surface or layer. Thermal conductivity of the material used in the treatment 110 may be varied to control the heat conduction transversely within the surface or layer. The variance of the thermal conductivity in the transverse direction may serve to conduct the heat away from one or more hot spots to one or more cooler spots of the structure of the device while providing for a more consistent outer temperature of the device.

The treatments 110 may use patterns of thermally conductive or insulating substances. The patterns may exhibit at least partial symmetry, such as radial symmetry or symmetry about an axis in the x-y plane parallel to the surface of the structure. In some cases, patterns may be asymmetric. The material of the treatment 110 may include different patterns of different substances, either at the same z-level relative to a surface of the structure, or at different z-levels. For example, a first material may be emplaced in a regular repeating grid while a second material may be emplaced over at least a portion of the first material with regard to maintaining a particular pattern.

Some implementations may employ a substance in the treatment 110 that is directionally anisotropic with regards to at least thermal conductivity. For example, graphene may be employed which exhibits a higher thermal conductivity in a transverse, x-y plane than it does along a z-axis. Such anisotropic substances may be employed to create heat corridors to move heat transversely along a surface from a hot spot to a cool spot, while at least partly inhibiting the conduction of the heat along a z-axis through the structure. Other implementations may employ substances that are more isotropic in thermal conductivity, exhibit variable isotropy, and so forth.

As used herein, thermal conductivity refers to a rate of diffusion of heat through a material. Different materials may have different thermal conductivities. As used here, a material or substance referred to as a thermal conductor may have a thermal conductivity that is higher than a threshold conductivity. For example, a substance may be considered a thermal conductor if its thermal conductivity is higher than 2 Watts/meter×Kelvin at room temperature. A material or substance referred to as a thermal insulator may have a thermal conductivity that is lower than a threshold conductivity. For example, a substance may be considered a thermal insulator if its thermal conductivity is lower than 2 Watts/meter×Kelvin at room temperature.

Figure 2:
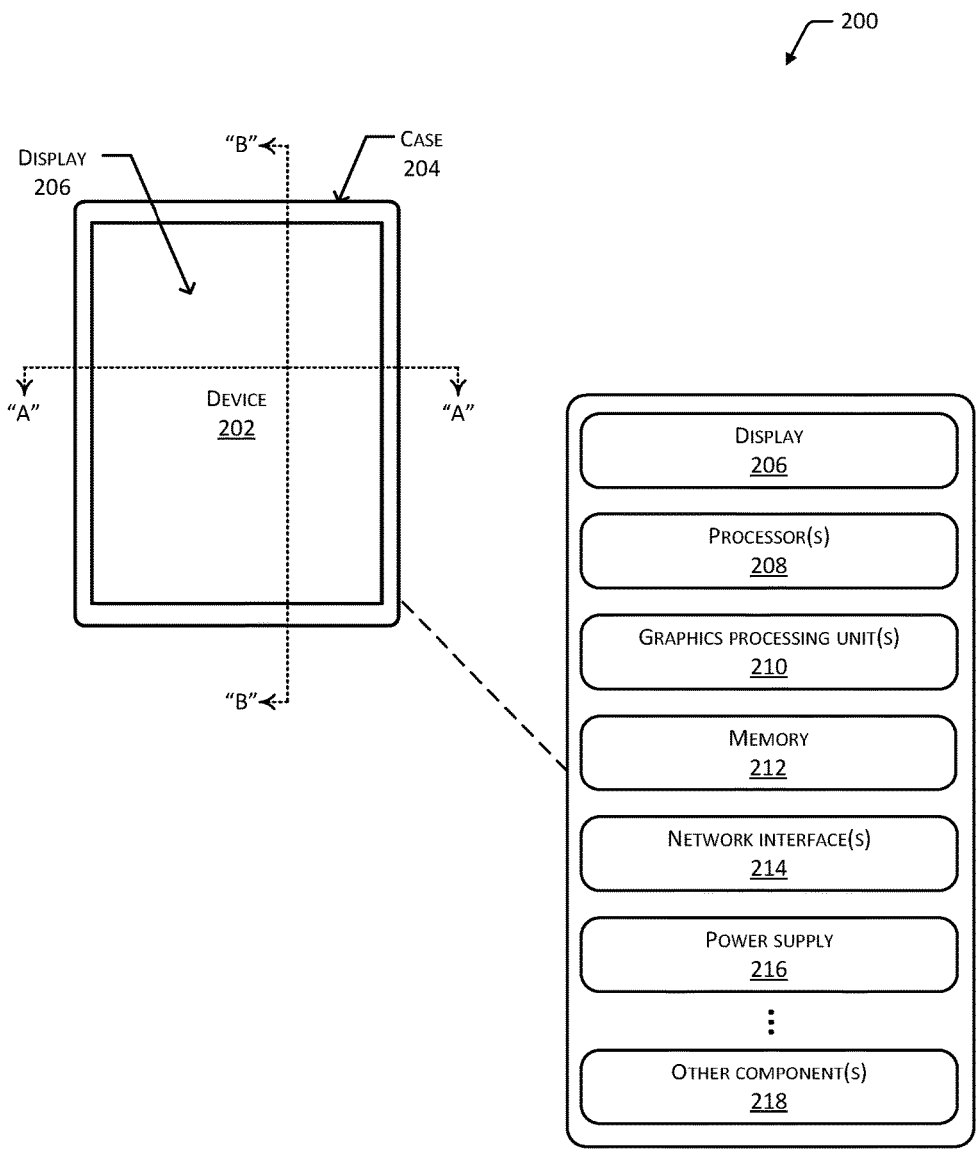
FIG. 2 depicts an example architecture for the device of FIG. 1 which may utilize one or more thermal distribution treatments.

FIG. 2 depicts a schematic 200 of an example device 202 which may employ features such as the various thermal distribution treatments 110 described herein. Implementations may be employed using any type of device 202, including but not limited to a mainframe computer, a server computer, a desktop computer, a personal computer, a laptop computer, a tablet computer, an electronic book reader, a wearable computer, an implanted computer, a mobile phone, a thin client, a terminal, a game console, a mobile gaming device, and the like. Implementations may also be used in other types of industrial, commercial, and consumer electronics devices, such as televisions, video monitors, audio system components, network infrastructure devices, printers, scanners, industrial controls, commercial appliances, and so forth. Moreover, although the examples discussed herein refer to devices with heat generating electronic components, implementations may also be employed to alter the thermal properties of devices that may include one or more heat generating mechanical components.

As shown in FIG. 2, device 202 has a case 204 which at least partly encloses one or more components of device 202. The case 204 may be composed of a thermally conductive substance such as a metal, a thermally insulating substance such as plastic or ceramic, or any combination of various substances. In the example shown, device 202 includes a display 206, such as a light-emitting diode (LED) display, a liquid crystal display (LCD), an electrophoretic display, or another type of display.

The device 202 may include various components, including electronic components or mechanical components. At least some of these components may generate heat during their operation. In the example shown, the device 202 includes one or more processors 208. The processor(s) 208 may be configured to execute one or more stored computational instructions, and may comprise one or more cores. The processor(s) 208 may be on one or more dies or incorporated into a motherboard of the device 202.

The device 202 may also include one or more graphics processing units (GPUs) 210 which operate to receive image information and build images and video streams to be displayed on the display 206. The GPU(s) 210 may be included on a video card, or on a motherboard of the device 202. In some cases, at least some functionality of the GPU(s) 210 may be incorporated into the processor die that includes the processor(s) 208.

The device 202 may include a memory 212, which may be one or more of an electronic storage medium, a magnetic storage medium, an optical storage medium, a quantum storage medium, a mechanical storage medium, and so forth. The memory 212 may provide storage of computer readable instructions, data structures, program modules, and other data for the operation of the device 202. The device 202 may include one or more network interface(s) 214 such as transmitter(s) or transceiver(s), to enable the device 202 to communicate with other devices over a wired or wireless network. The device 202 may also include a power supply 216, such as a battery. The device 202 may include one or more other components 218, such as input/output (I/O) interface(s), I/O device(s), and the like.

Figure 3:
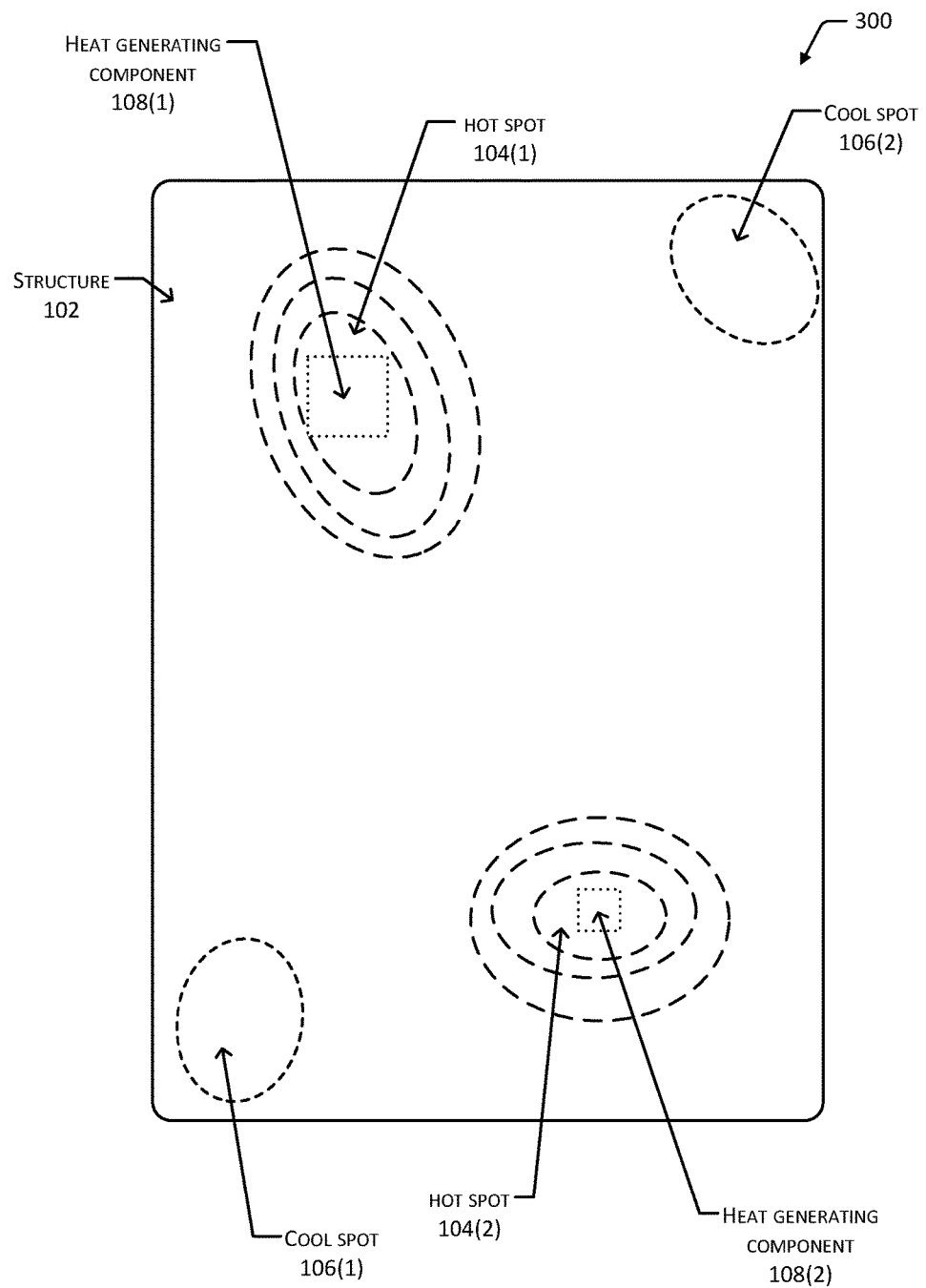
FIG. 3 depicts an example thermal distribution in a structure of the device without the thermal distribution treatments described herein.

FIG. 3 depicts an example thermal distribution 300 of the structure 102 without the thermal distribution treatment 110 applied to the structure 102. Accordingly, the thermal distribution 300 exhibits a less uniform distribution of heat across the structure 102, with the hot spots 104(1) and 104(2) being more localized and exhibiting greater local temperatures than in the example distribution 100.

Figure 4:
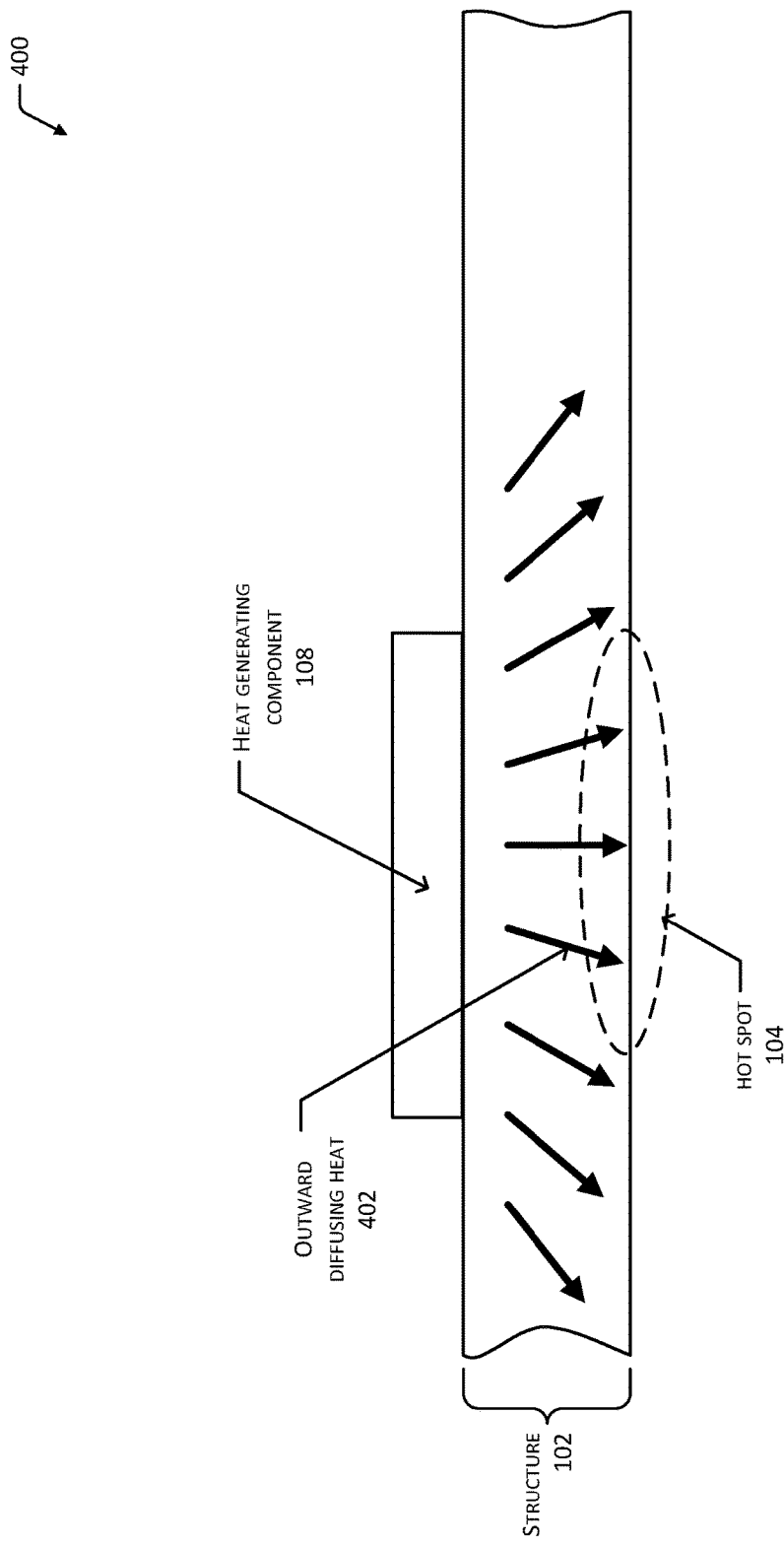
FIG. 4 depicts a cross sectional schematic of an enlarged portion of the device of FIG. 1 with at least one hot spot caused by operation of a component of the device and without the one or more thermal distribution treatments.

FIG. 4 depicts a schematic 400 of a cross sectional view of the structure 102 without the treatment 110. As shown, the structure 102 exhibits a hot spot 104 caused by the heat generated from the operation of the heat generating component 108. In this example, outward diffusing heat 402 is conducted through the structure 102 from an interior surface to an exterior surface. In FIG. 4 and in other figures, heat is represented as a vector quantity with the arrow indicating a direction in which the heat is conducted. In the example shown in schematic 400, the outward diffusing heat 402 may be a vector quantity with an orthogonal component that is substantially orthogonal to a surface of the structure 102, and with a transverse component that is substantially parallel to a surface of the structure 102. Without the treatment 110 described herein, the outward diffusing heat 402 is conducted outward through the structure 102 non-uniformly, causing the externally manifested hot spot 104.

Figure 5:
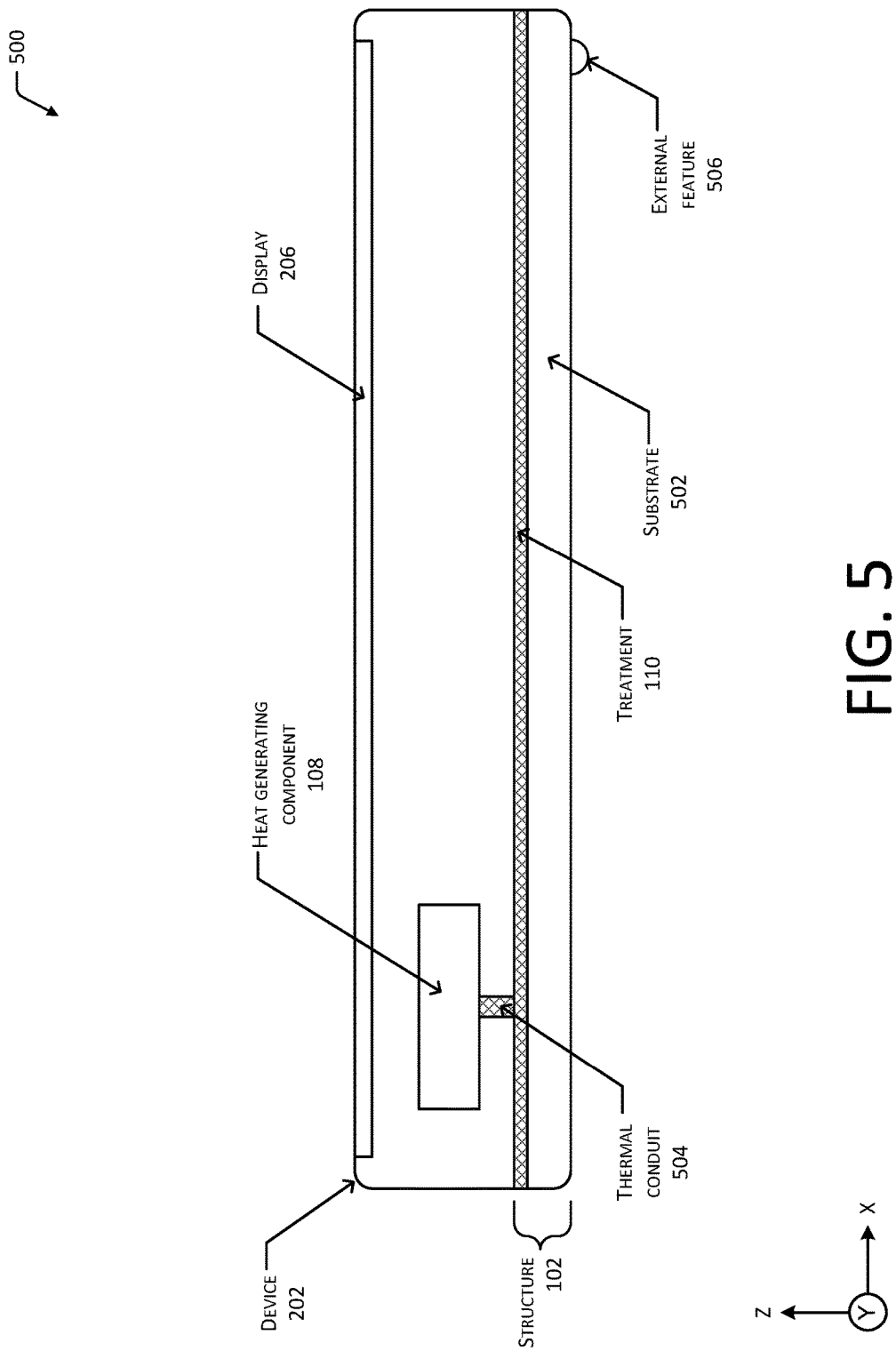
FIG. 5 depicts a cross sectional schematic of the device of FIG. 1, including a treatment on an interior surface.

FIG. 5 depicts a cross sectional schematic 500 of the device 202 along line "A", including a feature to facilitate heat distribution. In this case, the feature comprises a treatment 110 on an interior surface of the structure 102. In the implementation shown, the structure 102 is a back wall of the device 202, on a side of the device 202 opposite the display 206. In other implementations, treatments 110 may be used with any of the structures 102 of the device 202, and are not limited to treatments 110 on the back wall.

In the implementation shown, the structure 102 includes the treatment 110 and a substrate 502. For example, the substrate 502 may comprise polytetrafluoroethylene (PTFE) and the treatment 110 may be printed upon the substrate 502 prior to assembly. The treatment 110 illustrated here is on an interior surface of the structure 102, and the substrate 502 is between the treatment 110 and an exterior surface of the device 202.

In some embodiments, the treatment 110 is composed of a substance that has a higher thermal conductivity than the substrate 502, such that the treatment 110 is a thermal conductor relative to the substrate 502, and the substrate 502 is a thermal insulator relative to the treatment 110. In some implementations, a thermal conduit 504 may be thermally coupled both to the heat generating component 108 and the treatment 110 to allow heat generated by the heat generating component 108 to transfer via conduction to the treatment 110.

In some implementations, the device 202 may include one or more exterior features designed to improve distribution of heat to the environment within which the device 202 resides. For example, the device 202 may include on its outer surface an external feature 506, such as a heat sink, plate, fin, protuberance, or other external thermal radiation structure. In such cases, the treatment 110 may be arranged as a heat corridor to conduct heat from a hot spot toward the location of the external feature 506, to enable the heat to more efficiently be radiated away from the device 202.

Figure 6:
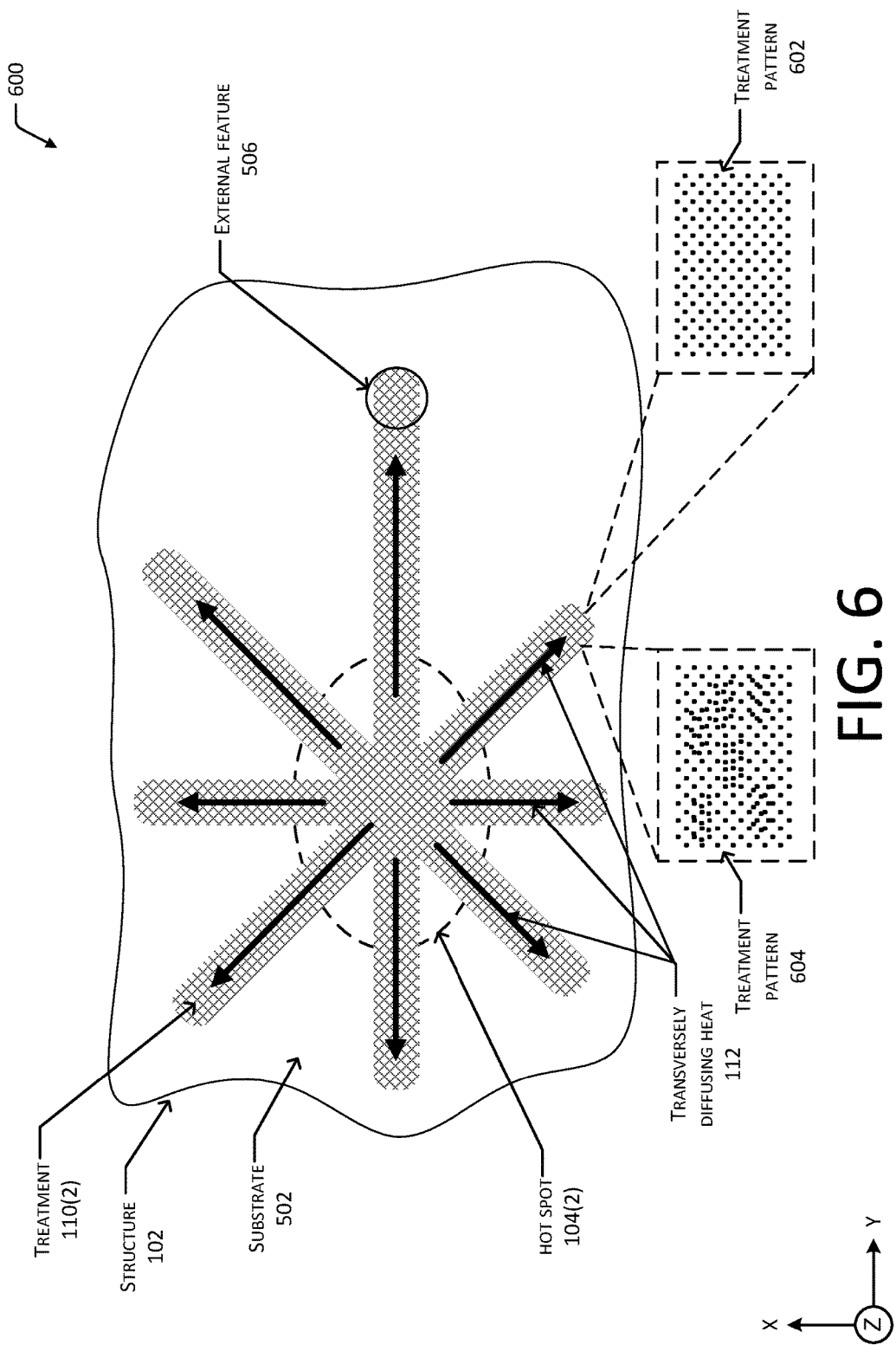
FIG. 6 depicts a plan view schematic of a structure for the device, including a radially symmetric treatment on a surface of the structure.

FIG. 6 depicts a schematic 600 of a plan view of the structure 102 shown in schematic 500, including the treatment 110 on a surface of the structure 102. In the implementation shown, the treatment 110 is imposed on the substrate 502, on an interior surface of the structure 102. In this example, the treatment 110 is at least partly radially symmetric, with portions radiating outward from a point corresponding to the hot spot 104.

In this example, the treatment 110 is a thermally conducting substance. In other implementations, the treatment 110 may be a thermal insulator. The treatment 110 may be arranged to control the transversely diffusing heat 112 transversely along a surface of the structure 102 away from the hot spot 104 to another portion of the structure.

In some implementations, the device 202 includes one or more external thermal dissipation structures such as the external feature 506. In such cases, the treatment 110 may be arranged to enable the transversely diffusing heat 112 to be efficiently conducted in a transverse direction to a location on the substrate 502 that is proximal in the x-y transverse plane to the external feature 506. For example, the treatment 110 may carry heat to a spot underneath the external feature 506.

The example implementation of FIG. 6 includes a magnified view of the treatment 110(2) and a further enlargement illustrating a treatment pattern 602. In some implementations, the treatment pattern 602 for a thermally conducting or thermally insulating treatment 110 may be composed of an arrangement of shapes of the substance or material that forms the treatment 110. Such shapes may be circular, elliptical, polygonal, or irregularly shaped. The shapes may have any degree or type of symmetry, or may be asymmetric. The shapes may be at least partly contiguous, or may be separated. For example, in cases where the treatment 110 is a thermally conducting material, the shapes may be at least partly contiguous to facilitate heat conduction. In cases where the treatment 110 is a thermally insulating material, the shapes in the treatment pattern 602 may be separated to inhibit heat transfer. The shapes may be arranged with any thickness, or in multiple layers of the same or differing substances to facilitate thermal conduction or insulation. In the example shown, the treatment pattern 602 is a regular repeating pattern. However, implementations may employ patterns that are random, pseudo-random, or irregular to any degree, such as irregular treatment pattern 604.

Figure 7:
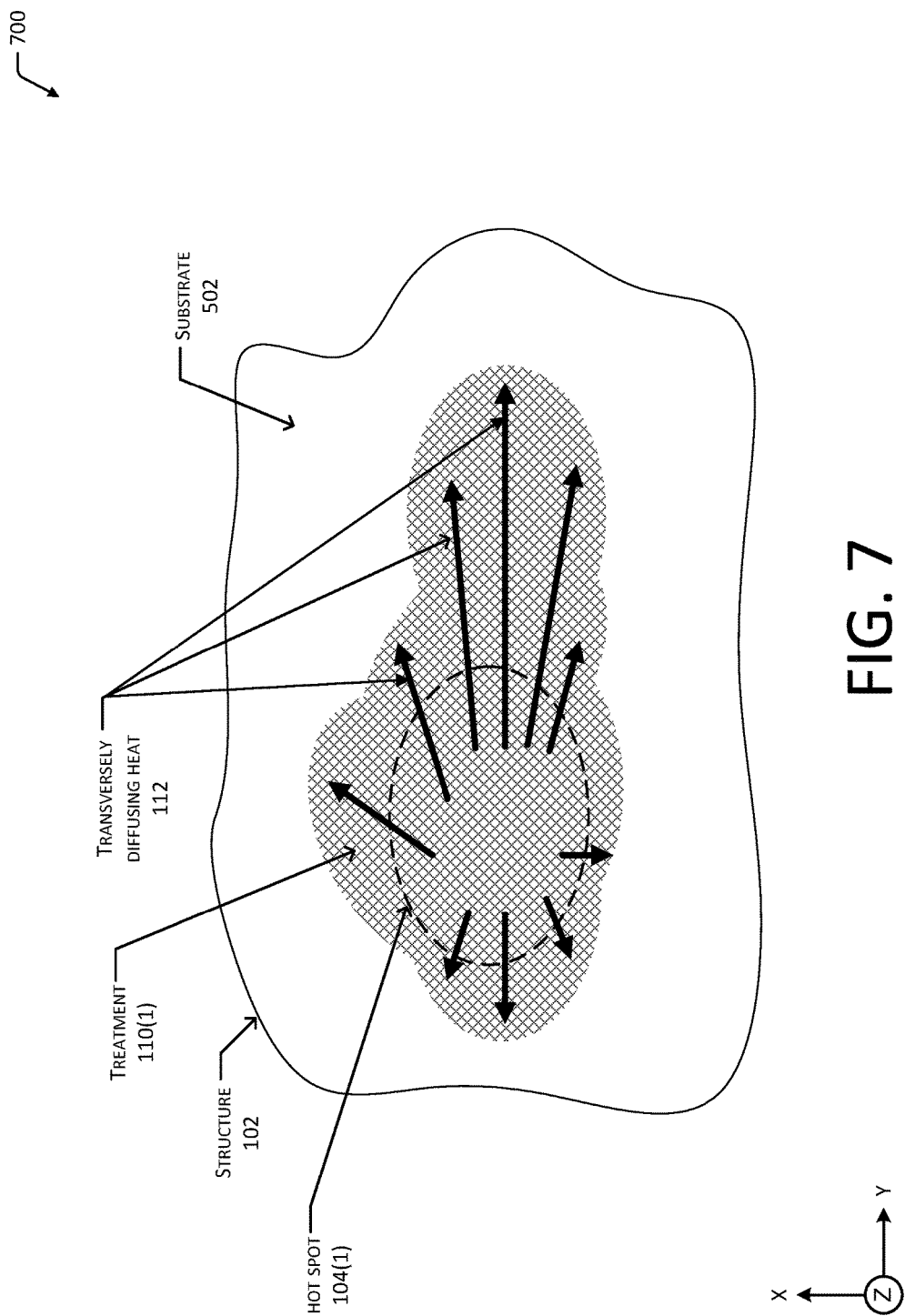
FIG. 7 depicts a plan view schematic of a structure for the device, including an asymmetric treatment on a surface of the structure.

FIG. 7 depicts an implementation having a feature for heat distribution, the feature including a treatment 110 that is not symmetric. The treatment 110(1) is arranged in an asymmetric arrangement to conduct the transversely diffusing heat 112 transversely away from the hot spot 104(1). The treatments 110 may exhibit any type of symmetry relative to the structure 102 being treated, including radial symmetric about one or more center points, lateral symmetry about one or more axes, partial symmetry of any type, or any combination of symmetries. The treatments 110 may also exhibit no symmetry relative to the structure 102 being treated.

In implementations where the treatment 110 is a thermally conducting material imposed on the substrate 502 which is a thermally insulating material, the treatment 110 may be arranged such that its thermal conductivity varies over the structure being treated. In some implementations, the thermal conductivity of the treatment 110 may decrease with increasing distance from a point in the hot spot 104, along one or more vectors radiating outward from one or more points in the hot spot 104.

In implementations where the treatment 110 is a thermally insulating material imposed on the substrate 502 which is a thermally conducting material, the treatment 110 may be arranged such that its thermal resistivity varies over the structure being treated. In some implementations, the thermal resistivity of the treatment 110 may decrease with increasing distance from a point in the hot spot 104, along one or more vectors radiating outward from one or more points in the hot spot 104.

Figure 8:
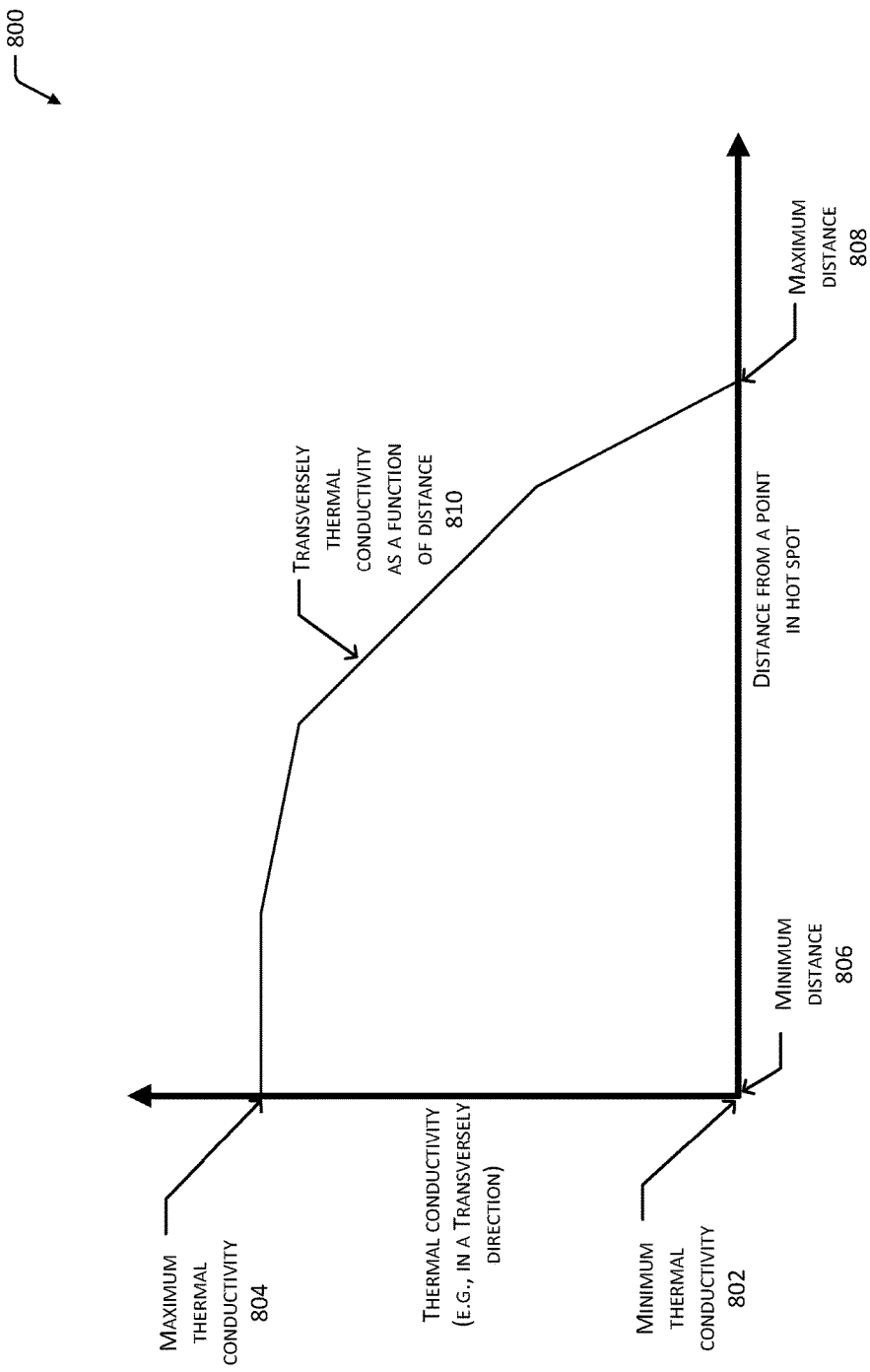
FIG. 8 depicts a graph of thermal conductivity for a treatment, varying as a function of distance outward from a hot spot.

FIG. 8 illustrates as a graph 800 a variance in thermal conductivity for the treatment 110, varying as a function of distance outward from the hot spot 104. In graph 800, the vertical axis is a thermal conductivity from a minimum thermal conductivity 802 to a maximum thermal conductivity 804. In some cases, the minimum thermal conductivity 802 is the thermal conductivity of the substrate 502, e.g., the thermal conductivity at a point on the surface where there is no treatment 110. The horizontal axis is a distance from a point in the hot spot 104 from a minimum distance 806 to a maximum distance 808 (e.g., the extent of the treatment 110 along the surface). In cases where the treatment 110 is a material that is anisotropic in thermal conductivity, such that its thermal conductivity in a transverse direction (e.g., in plane) differs from its thermal conductivity in a direction orthogonal to the transverse (e.g., out of plane), the vertical axis may measure thermal conductivity in a transverse direction.

As shown in graph 800, the transverse thermal conductivity as a function of distance 810 may decrease as the distance from a point in the hot spot 104 increases, such that transverse thermal conductivity decreases with distance from the hot spot 104. In this way, implementations may allow for a more efficient transverse movement of heat outward from the hot spot 104 at locations near the hot spot 104, and less efficient movement of heat outward as the distance from the hot spot 104 increases. In some implementations, the transverse variation of the thermal conductivity may be through a variation in a thickness of the treatment 110. For example, for some materials a thicker layer of conducting material may provide for a higher thermal conductivity. In some implementations, the variation in thermal conductivity may be accomplished through a variation in the pattern in which the material of treatment 110 is placed, such as patterns 602 and 604, or through a variation of the density of the material. In some implementations, the transverse thermal conductivity may increase with distance from the hot spot 104. Further, in some implementations the transverse thermal conductivity may exhibit one or more inflection points where it changes from increasing to decreasing, or from decreasing to increasing.

Implementations support the use of any type of thermal conductor in the treatment 110, including metals such as copper, aluminum, nickel, or other metals. Implementations may also support the use of thermally conductive inks. The above-listed substances are generally isotropic and non-directional in thermal conductivity. Implementations also support the use of anisotropic substances, which may have a thermal conductivity that varies based on direction. For example, graphene is a substance composed of carbon atoms arranged in sheets, where each sheet is a hexagonal arrangement of carbon atoms. The thermal conductivity of graphene in a transverse direction in plane with the sheets is approximately 100 times greater than its thermal conductivity out of plane, in an orthogonal direction from one sheet to another sheet. Implementations may employ graphene in at least a portion of the treatment 110 to provide for more efficient heat transport transversely away from the hot spot 104.

In some implementations, the transverse variation of the thermal conductivity may be accomplished through the use of multiple conducting materials having different thermal conductivities in the treatment 110. For example, the treatment 110 may include a higher thermally conductive substance closer to the hot spot 104, and a lower thermal conductive substance farther from the hot spot 104. As another example, the treatment 110 may be a combination of two or more substances with different thermal conductivities. The treatment 110 may employ a combination with a higher proportion of a more conductive substance closer to the hot spot 104, and a combination with a lower proportion of the more conductive substance farther from the hot spot 104. In this way, the transverse thermal conductivity of the structure may be altered to provide for efficient conduction of heat away from the hot spot 104.

Figure 9:
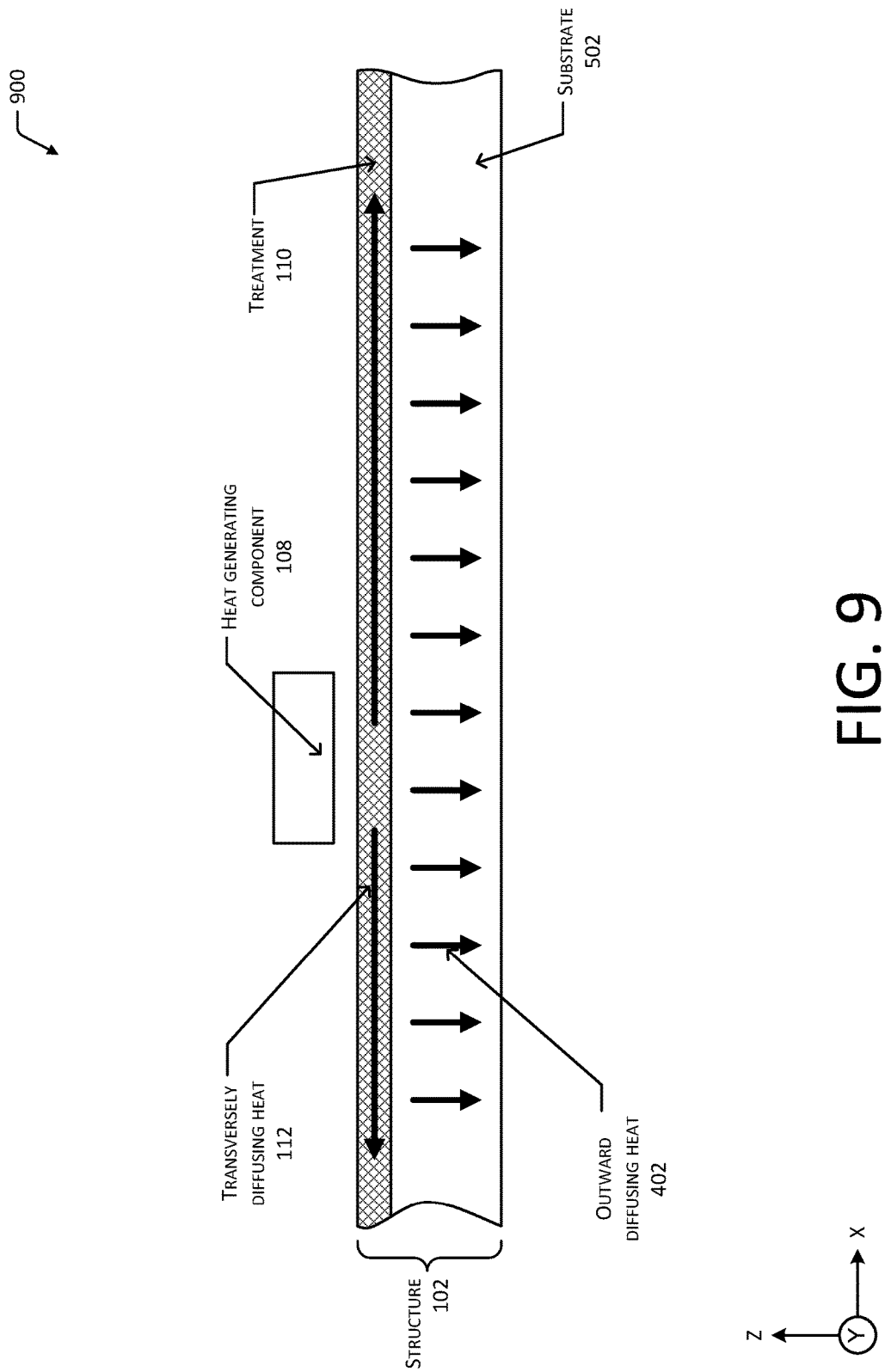
FIG. 9 depicts a cross sectional schematic of a structure for the device including a treatment to conduct heat transversely along a surface of the structure.

FIG. 9 depicts a cross sectional schematic 900 of one implementation of the structure 102. As shown, the treatment 110 enables the transversely diffusing heat 112 to be conducted transversely away from the heat generating component 108. Because the transversely diffusing heat 112 is spread transversely in the treatment 110, the outward diffusing heat 402 conducted outward through the substrate 502 is more evenly distributed transversely across the structure 102. Consequently, the temperature of an outer surface of the structure 102 may be more uniform, or exhibiting fewer or less extreme hot spots 104, than would otherwise be the case in the absence of the treatment 110. The schematic 900 illustrates implementations in which the treatment 110 is substantially uniform in thickness. In such cases, the thermal conductivity may be varied through use of different conducting substances or a varying mixture of thermally conducting and insulating substances in the treatment 110, to provide for more efficient diffusion of the transversely diffusing heat 112 closer to a hot spot.

Although FIG. 9 and other figures depict the heat generating component 108 as separated from the treatment 110, in some cases the heat generating component 108 may be adjacent to the treatment 110 or thermally coupled to the treatment 110. For example, a thermal conduit may conduct heat from the heat generating component 108 to the treatment 110.

Figure 10:
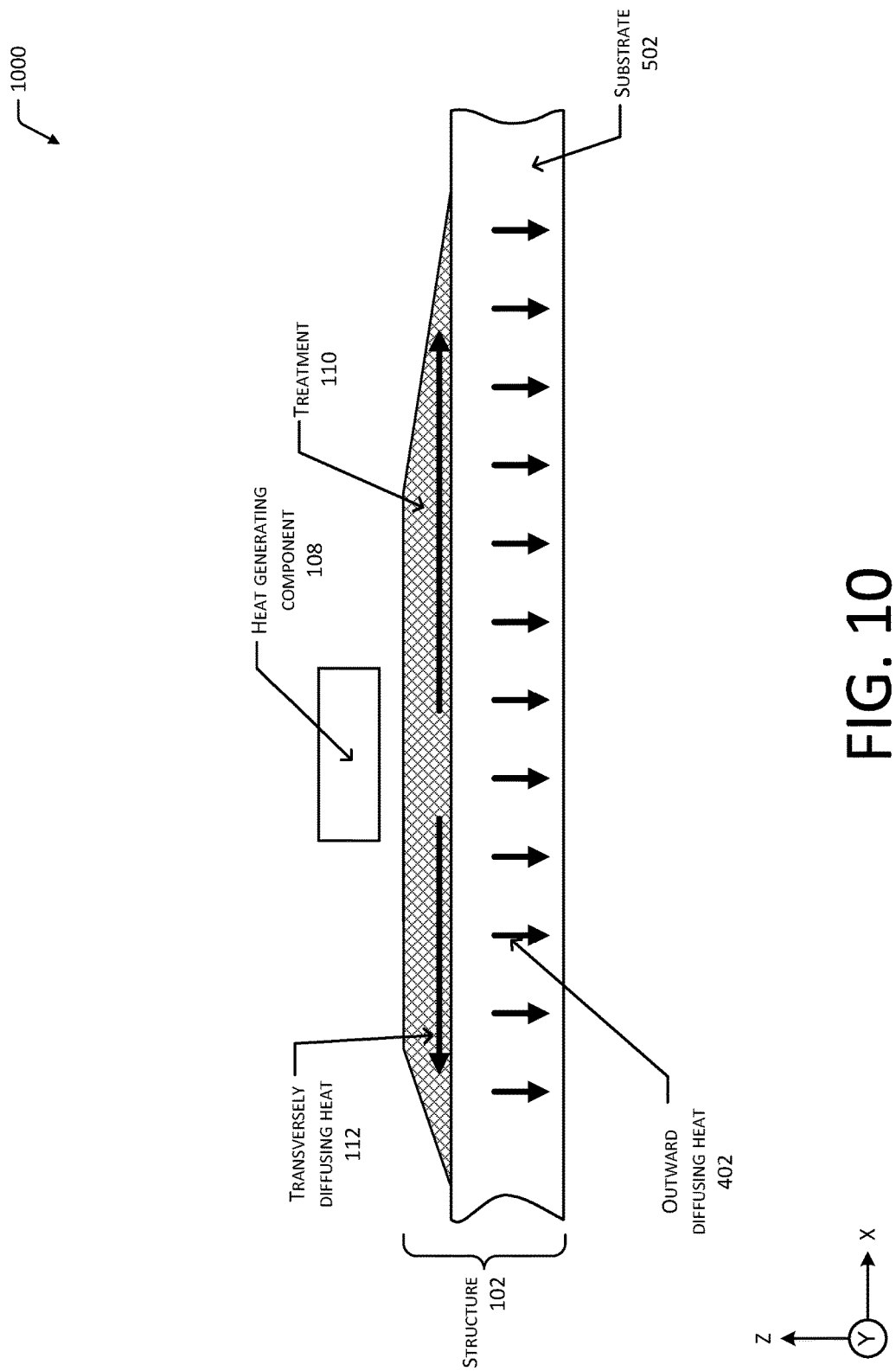
FIG. 10 depicts a cross sectional schematic of a structure for the device which includes a treatment of varying thickness on an interior surface of the structure to conduct heat transversely.

FIG. 10 depicts a cross sectional schematic 1000 of another implementation of the structure 102. The schematic 1000 illustrates an implementation in which the thickness of the treatment 110 varies across a surface of the structure 102. For example, the thickness of the treatment 110 may be inversely proportional to a distance from a hot spot 104, to provide for a thermal conductivity that decreases with distance from the hot spot 104. Because the transversely diffusing heat 112 is spread transversely in the treatment 110, with greater efficiency closer to the hot spot, the outward diffusing heat 402 conducted outward through the substrate 502 may be more evenly distributed across the structure 102.

Figure 11:
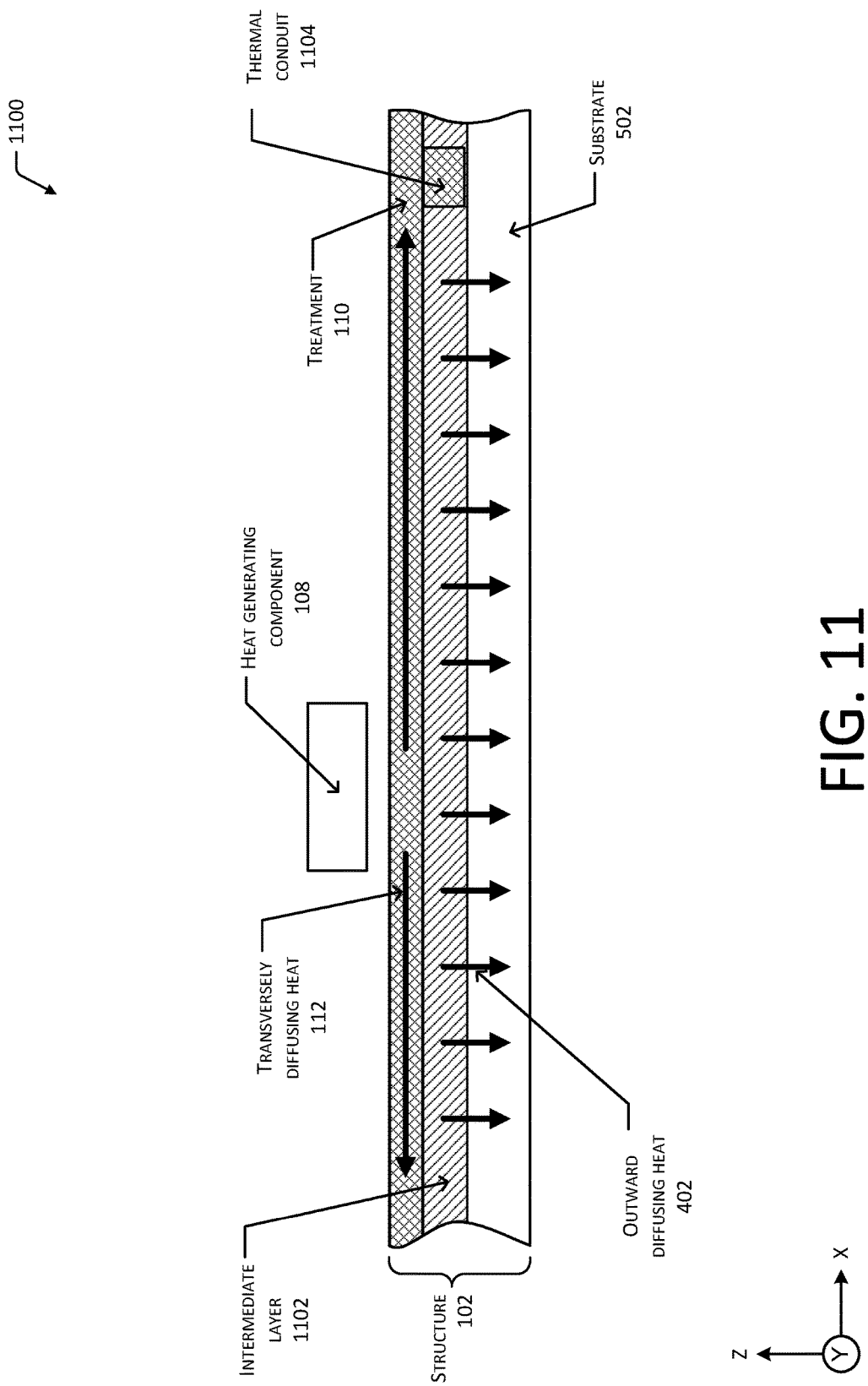
FIG. 11 depicts a cross sectional schematic of a structure for the device, including a multi-layered treatment to conduct heat transversely in the structure.

FIG. 11 depicts a cross sectional schematic 1100 of another implementation of the structure 102, in which the features for heat distribution include a multi-layered arrangement to conduct heat from the heat generating component 108 transversely along the structure 102. In this implementation, an intermediate layer 1102 is arranged between the treatment 110 and the substrate 502. In some implementations, the treatment 110 may be a thermally conducting substance, and the intermediate layer 1102 may be a thermally insulating substance, or a substance that has a lower thermal conductivity than the treatment 110. Implementations support any type of thermal insulator, including an aluminum oxide or other metal oxides, plastics, aerogels, ceramics, various silicates, or other thermally insulating materials. For example, the intermediate layer 1102 may comprise polytetrafluoroethylene.

The use of an insulating intermediate layer 1102 may provide for more efficient transverse conduction of the transversely diffusing heat 112 away from the hot spot 104. In some implementations, the thickness of one or more of the treatment 110 and the intermediate layer 1102 may vary with location on a surface of the structure 102. For example, thickness of the insulating, intermediate layer 1102 may decrease with distance from the hot spot 104, to allow more outward diffusing heat 402 heat to diffuse outward along the z-axis direction to an external surface of the structure 102 as the transverse distance increases from the hot spot 104.

Some implementations may include at least one thermal conduit 1104, which thermally couples the treatment 110 to the substrate 502. Use of the thermal conduit 1104 may increase the efficiency of heat diffusing from the treatment 110 to the substrate 502.

Although FIG. 11 depicts the intermediate layer 1102 and the treatment 110 having a similar extent along the surface of the substrate 502, embodiments are not so limited. In some cases the intermediate layer 1102 span a different surface area, have a different shape than the treatment 110, or the treatment 110 may partially overlap the intermediate layer 1102.

Figure 12:
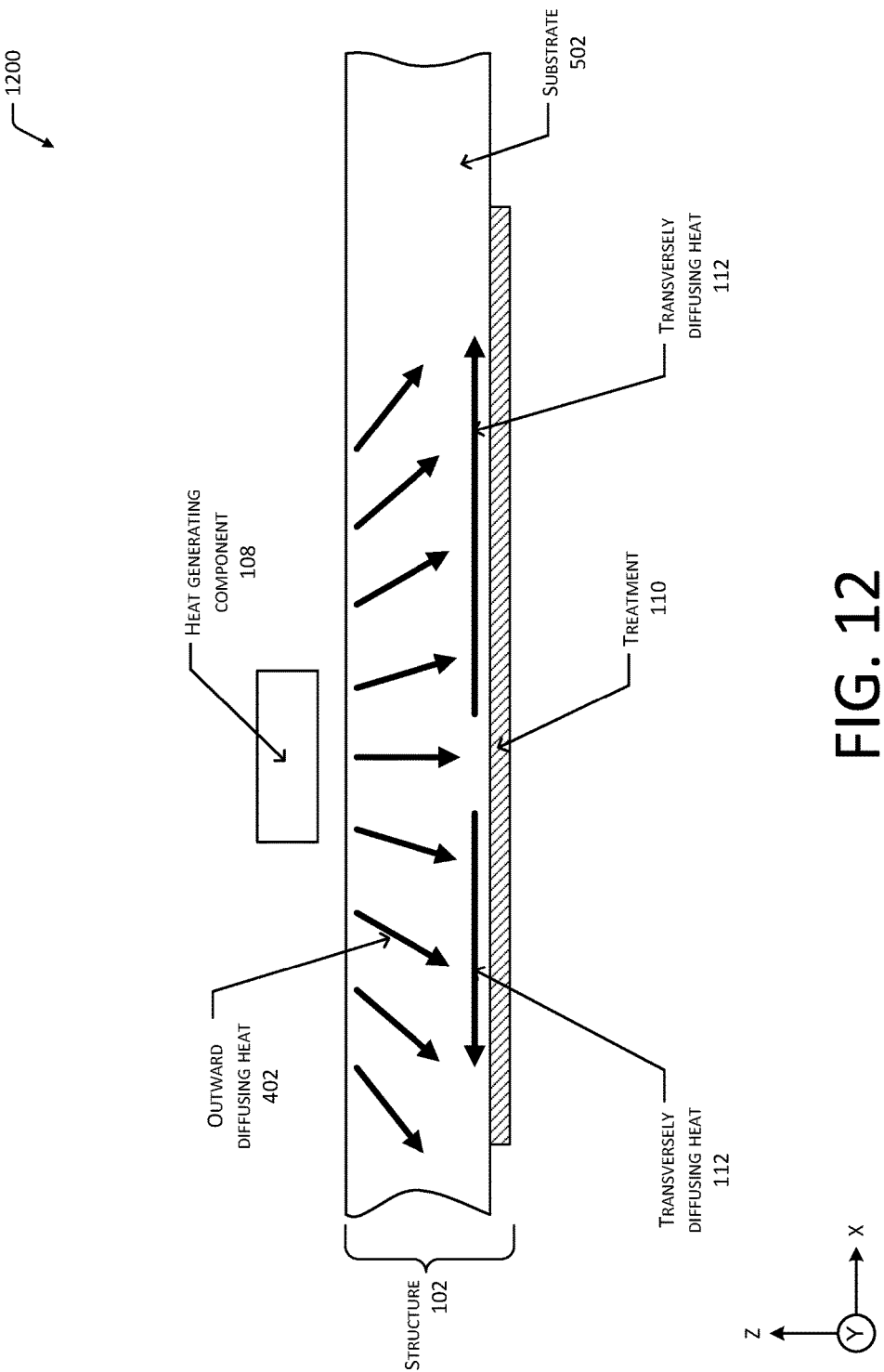
FIG. 12 depicts a cross sectional schematic of a structure for the device, including a treatment on an exterior surface of the structure to conduct heat transversely in the structure.

FIG. 12 depicts a schematic 1200 of a cross sectional view of the structure 102, including a heat distribution feature that comprises the treatment 110 on an exterior surface of the structure 102 to conduct heat transversely in the structure 102. In the implementation shown, the structure 102 includes the substrate 502 that may be a thermally conducting substance such as aluminum, another metal, or combination of metals. The treatment 110 on an exterior surface of the structure 102 comprises a thermally insulating substance. Operation of the heat generating component 108 may cause a hot spot, such that the outward diffusing heat 402 diffuses in a z-axis direction through the structure 102 toward an exterior surface. In this example, the outward diffusing heat 402 is uneven, with more heat diffusing outward at locations in the x-y plane closer to the hot spot caused by the heat generating component 108. As the outward diffusing heat 402 nears the thermally insulating treatment 110, it diffuses more transversely away from the center of the hot spot, as the transversely diffusing heat 112. In this way, implementations may provide for a more even temperature across the exterior of the structure 102. As illustrated here, the thickness of the treatment 110 may be substantially consistent. In such cases, the thermal resistivity (e.g., the reciprocal of thermal conductivity) of the treatment 110 may be varied through use of a varying mixture of different substances having different thermal resistivities.

Figure 13:
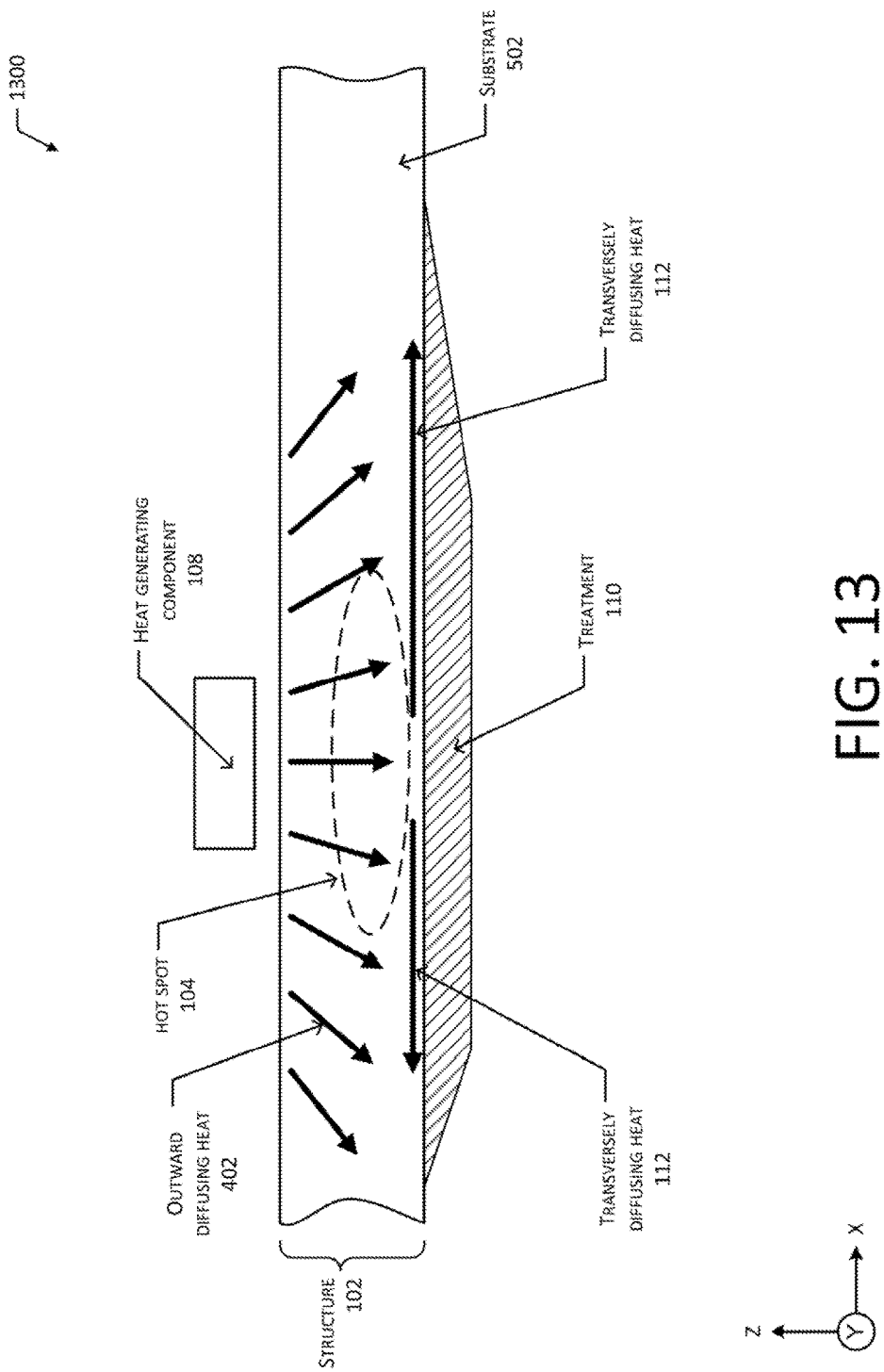
FIG. 13 depicts a cross sectional schematic of a structure for the device, including a treatment of varying thickness on an exterior surface of the structure to conduct heat transversely in the structure.

FIG. 13 depicts a cross sectional schematic 1300 of one implementation of the structure 102. This implementation shows the treatment 110 of varying thickness on an exterior surface of the substrate 502 of the structure 102 to conduct the transversely diffusing heat 112 in the structure 102. In this example, the treatment 110 is a thermally insulating material. As the outward diffusing heat 402 nears the insulating treatment 110, the treatment 110 provides for the transverse diffusion of heat 112 away from the hot spot 104 caused by the heat generating component 108, with greater transverse diffusion closer to the hot spot 104 given the varying thickness of the insulating treatment 110.

Figure 14:
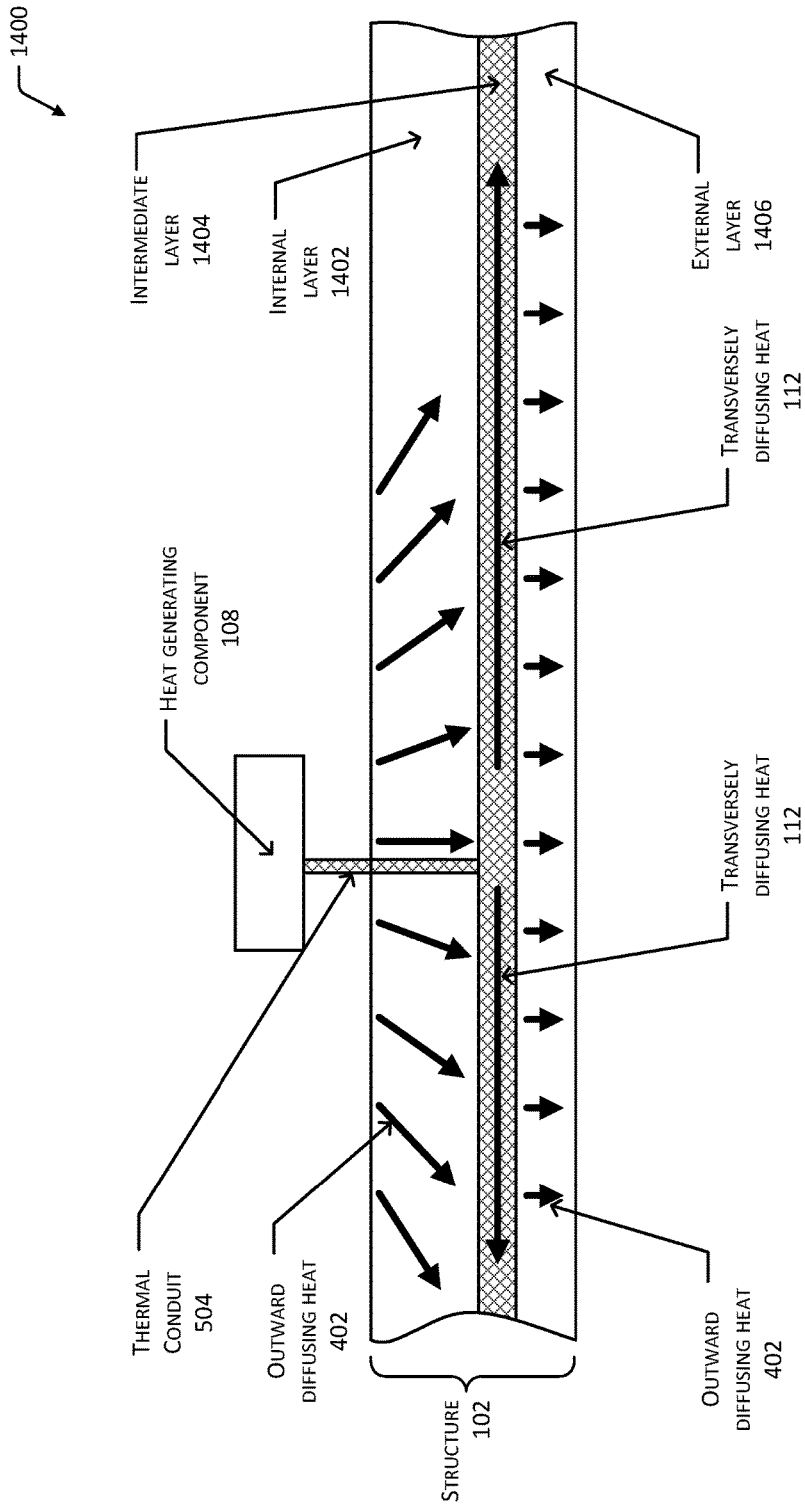
FIG. 14 depicts a cross sectional schematic of a structure for the device, including an intermediate layer to conduct heat transversely.

FIG. 14 depicts a cross sectional schematic 1400 of another implementation of the structure 102. In this example, the structure 102 includes features for heat distribution, including an internal layer 1402, an external layer 1406, and an intermediate layer 1404 between the internal layer 1402 and the external layer 1406. One or more of these layers may comprise treatments 110 deposited onto layers which are then assembled, or fabricated within the material of the structure 102.

In some implementations, the internal layer 1402 and the external layer 1406 are each composed of a thermally insulating substance or substances, and the intermediate layer 1404 is composed of a thermally conducting substance, or a substance that is more thermally conducting than layers 1402 and 1406. In the implementation shown, the outward diffusing heat 402 diffuses along a z-axis direction from an interior surface of the structure 102 through the interior layer 1402, to the intermediate layer 1404. On reaching the intermediate layer 1404, the outward diffusing heat 402 may then diffuse in a transverse direction away from the hot spot, as the transversely diffusing heat 112. In this way, the intermediate layer 1404 may provide for a more transversely uniform distribution of the transversely diffusing heat 112, so that the outward diffusing heat 402 may diffuse up through the external layer 1406 more uniformly. This may lead to a more uniform external temperature of the structure 102 or a pre-determined heat dissipation pattern.

Some implementations may further include a thermal conduit 504 that thermally couples the heat-generating component 108 with the thermally conductive intermediate layer 1404. The thermal conduit 504 may pass through the internal layer 1402, and may be composed of a thermally conductive material to enable more efficient diffusion of the outward diffusing heat 402 through the internal layer 1402 to the intermediate layer 1404.

In some cases, the intermediate layer 1404 may be arranged such that its thermal conductivity is higher toward the center of a hot spot, and lower with increasing distance from the hot spot. This may provide for a predetermined conduction of the transversely diffusing heat 112 in the intermediate layer 1404.

Figure 15:
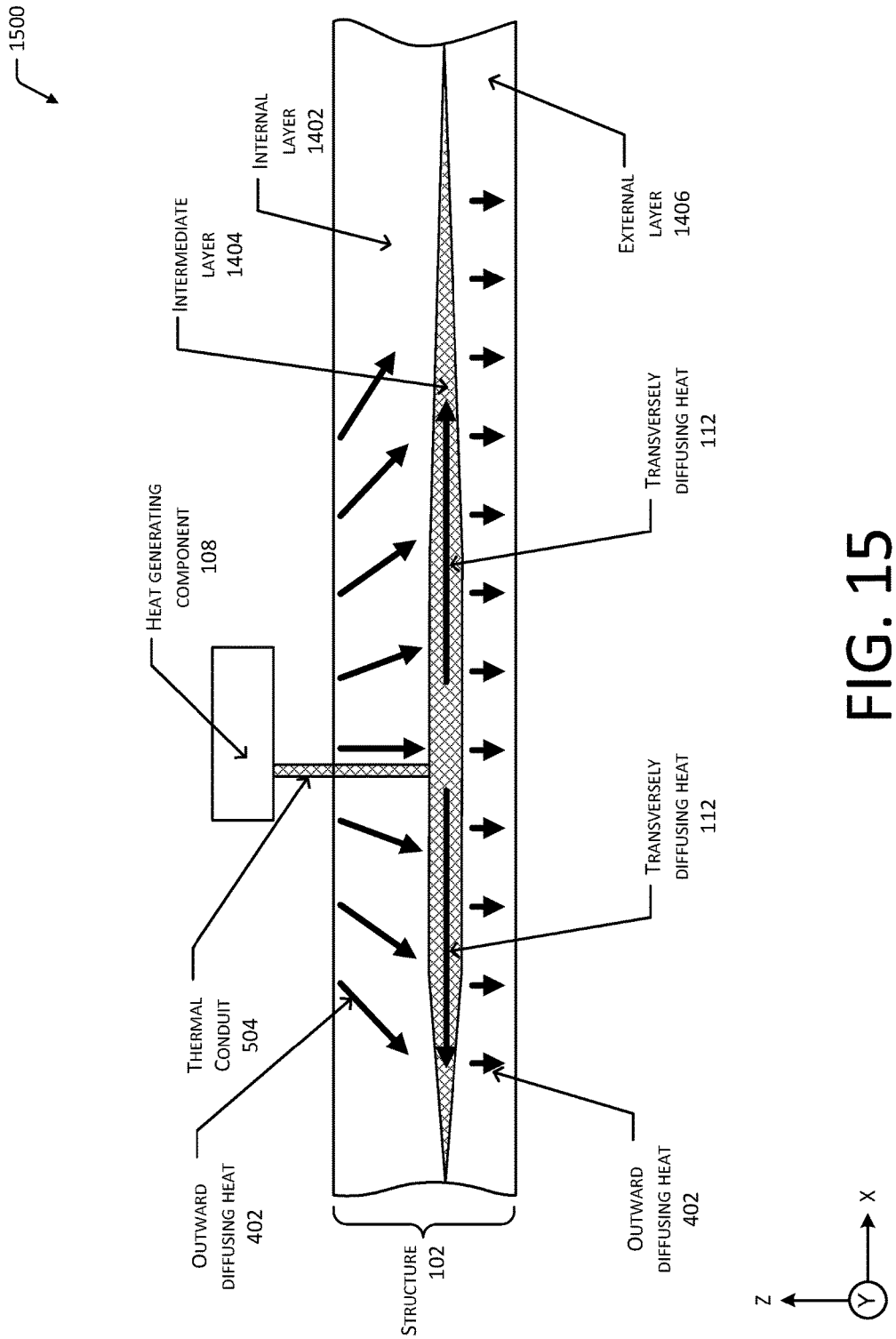
FIG. 15 depicts a cross sectional schematic of a structure for the device, including an intermediate layer of varying thickness to conduct heat transversely, the intermediate layer having a thickness that decreases with distance outward from a heat generating component.

FIG. 15 depicts a schematic 1500 of a cross sectional view of the structure 102, for some implementations. As above, the heat generating component 108 may couple to the intermediate layer 1404 with a thermal conduit 504. In this implementation, the intermediate layer 1404 is situated between the internal layer 1402 and the external layer 1406, and the thickness of the intermediate layer 1404 varies with distance from the hot spot 104 caused by the heat generating component 108. This may provide for a thermal conductivity of the intermediate layer 1404 that decreases with the transverse distance outward from the hot spot 104. This may enable more efficient transverse diffusion of the transversely diffusing heat 112 away from the hot spot, and may lead to a more uniform outward diffusion of the outward diffusing heat 402 as described above. In some implementations, the extents of the internal layer 1402, the intermediate layer 1404, and the external layer 1406 may differ, such that one or more of these layers cover different surface areas in the structure 102. Furthermore, as described above, the layers may comprise treatments 110 which are deposited onto an adjacent layer, or formed within the layer itself.

Figure 16:
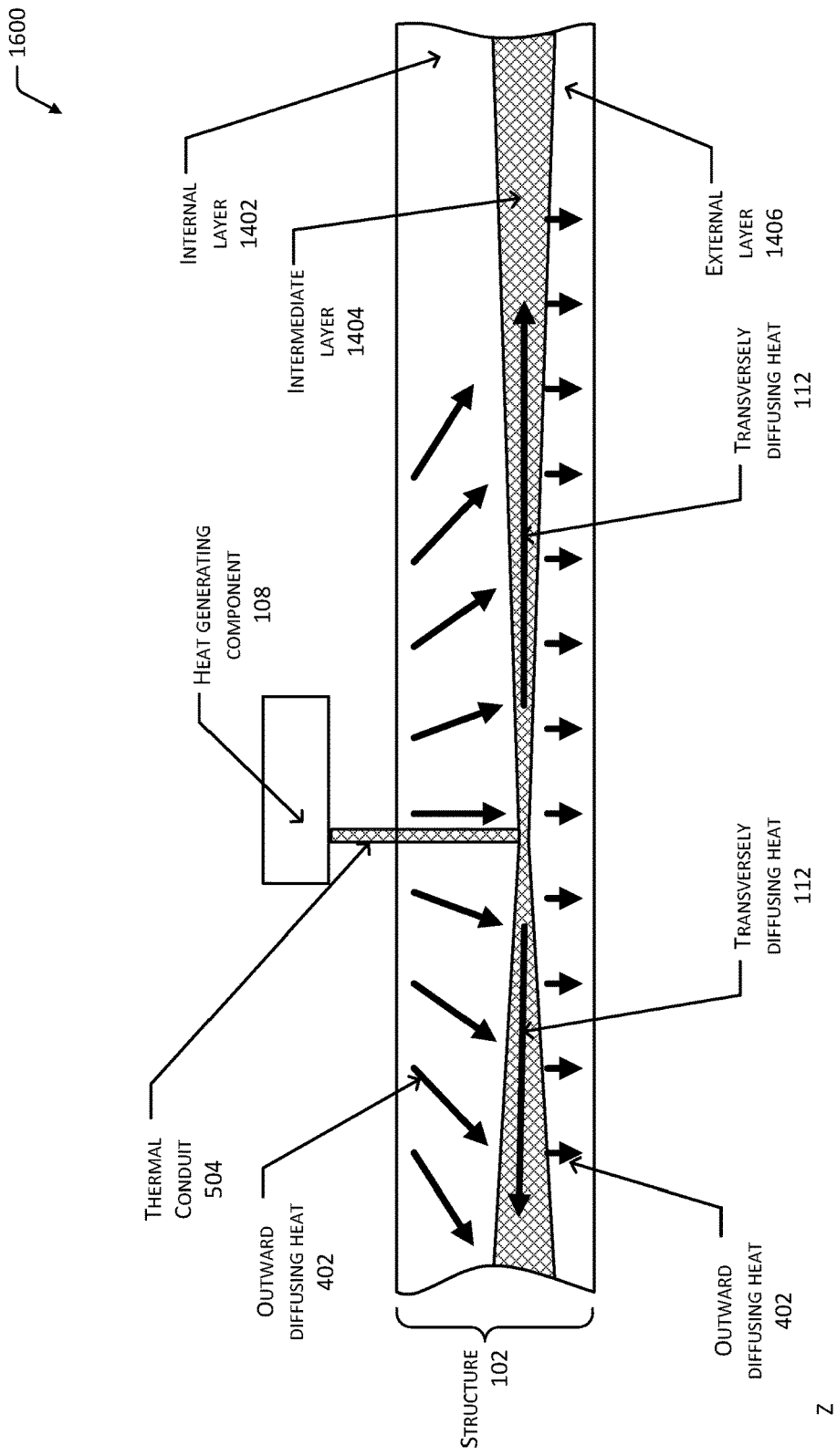
FIG. 16 depicts a cross sectional schematic of a structure for the device, including an intermediate layer of varying thickness to conduct heat transversely, the intermediate layer having a thickness that increases with distance outward from a heat generating component.

FIG. 16 depicts a cross sectional schematic 1600 of another implementation of the structure 102. As above with regard to FIG. 15, the intermediate layer 1404 may be arranged between the internal layer 1402 and the external layer 1406. As above, the thermal conduit 504 may couple the heat generating component 108 and the intermediate layer 1404. However, in this figure the thickness of the intermediate layer 1404 increases with distance from the hot spot 104 caused by the heat generating component 108, to provide for a thermal conductivity of the intermediate layer 1404 that increases with the transverse distance outward from the hot spot. In some implementations, this may enable transverse diffusion of the transversely diffusing heat 112 in a predetermined pattern away from the hot spot 104. This, in turn, may result in a more uniform outward diffusion of the outward diffusing heat 402 as described above.

In some implementations, the intermediate layer 1404 may not have a clearly defined transition to the internal layer 1402 or the external layer 1406, and may be composed of a material that is incorporated into the structure 102 as a dopant. For example, the intermediate layer 1404 may be a thermal conductor such as a carbon fiber material that is incorporated into the material of the structure 102 through a doping process to increase a thermal conductivity of a portion of the structure 102.

The various implementations described above may be combined in any way for additional implementations. For example, one or more implementations may include any combination of interior and exterior surface treatments, each with one or more patterns of thermally conducting or insulating material. Moreover, one or more implementations may include any combination of interior and exterior surface treatments with an intermediate layer for more efficient transverse diffusion of heat before it reaches the outer surface of a device. Various implementations may also incorporate heat corridors to transfer heat toward an external thermal radiation structure (e.g., a heat sink).

Illustrative Processes for Applying Treatments

Figure 17:
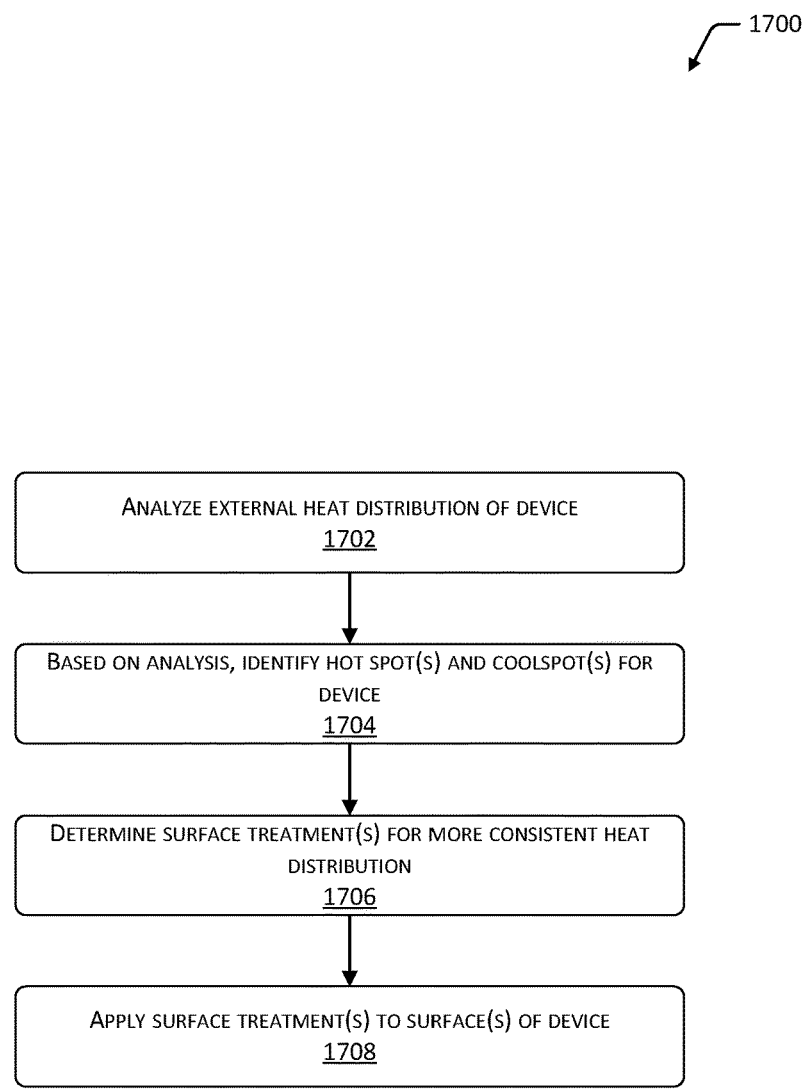
FIG. 17 depicts a flow diagram of a method of manufacture for applying a treatment to a wall, to alter the thermal conductivity of at least a portion of the wall.

FIG. 17 depicts a flow diagram 1700 of a process for applying a treatment to a structure 102, to alter the thermal conductivity of at least a portion of the structure 102. In some implementations, the process may be at least a portion of a method for manufacturing a device such as the device 202 or components suitable for use in the device 202.

At 1702, an external heat distribution of the device is analyzed. In some embodiments, this analysis may be based on an analytic model developed mathematically or computationally given known heat-generating characteristics of one or more components of the device, the materials composing the various components and casing of the device, the physical arrangement of the components and the casing, or other factors. In some embodiments, the analysis may be at least partly experimental and performed through real-time monitoring and thermal imaging of a device while it is operating. Some embodiments may include multiple stages in an analysis, with one or more early stages being based on a mathematical or computational model, and later stages including refinements of that model based on experimental observation of the device.

In some cases, the analysis of the device may be based on a normal operation mode for the device, based on previously observed and documented common use of the device by users. In some cases, the analysis of the device may be based on more unusual use conditions that may provide corner case example scenarios for operation of the device. For example, the analysis of the device may be performed where the device is being used to playback a long video file, such that the device may be running hotter than under non-playback conditions. In some embodiments, the analysis of the device may be based on the device running in a steady state, following a period of transient activity when the device itself or processes on the device are starting up.

At 1704, based on the analysis, one or more hot spots 104 may be identified for the device. In some implementations cool spots may also be identified. At 1706, one or more surface treatment(s) may be determined that provide for a predetermined heat distribution across one or more outer surfaces of the device. In some embodiments, where the analysis at 1702 is based on an analytic model, the determination of surface treatment(s) may be through a computational process to determine a surface treatment which minimizes or eliminates hot spots 104, reduces the intensity of hot spots 104, or generally provides for the greater uniformity in the outer temperature of the device. Such a calculation may be through a multivariate computational analysis that simultaneously minimizes one or more determined temperature maxima of hot spots 104, or minimizes a variance of the temperature across the outer surface of the device.

At 1708, the one or more determined surface treatments are applied to one or more surfaces of the device. Various methods may be employed to create patterns or layers of thermally conducting or thermally insulating substances on surfaces. To create patterns or layers of an insulating aluminum oxide or other metal oxide, an anodization process may be employed. To create patterns of layers of a conducting ink, an inkjet or other printing or lithographic process may be employed. Other possible methods of affixing or otherwise controlling the pattern of the substances include, but are not limited to, sputtering, painting, lamination, direct deposit onto another substance, labeling, plating, etching, and so forth.

Figure 18:
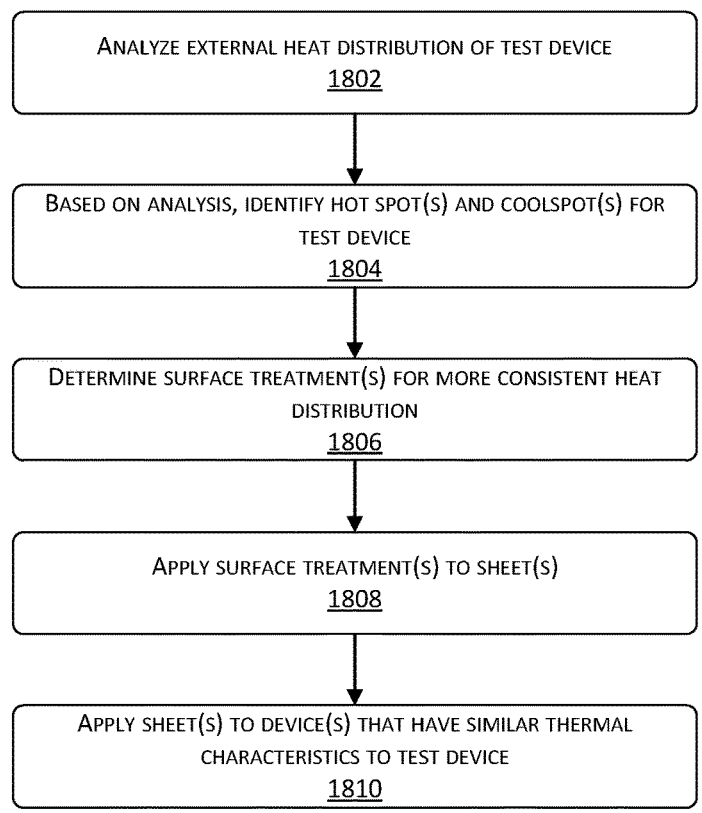
FIG. 18 depicts a flow diagram of a method of manufacture for a sheet that may be applied to a wall of a device, to alter the thermal conductivity of at least a portion of the wall.

FIG. 18 depicts a flow diagram 1800 of a process for applying a treatment to a substrate that may be applied to a structure of a device, to alter the thermal conductivity of at least a portion of the structure 102. In some implementations, the process may be at least a portion of a method for manufacturing a sheet to be used to alter the thermal properties of a device such as the device 202. In some implementations, the sheet may be designed and manufactured as an after-market product to be applied to a device previously purchased by an end-user. For example, the sheet may be at least a portion of a cover designed to fit the device and alter its thermal properties. As another example, the sheet may be a laminate, sticker, or label designed to be affixed to a surface of the device to alter its thermal properties.

At 1802, an analysis is performed of the external heat distribution of a test device. At 1804, based on the analysis, one or more hot spots 104 are identified for the test device. In some implementations cool spots 106 may also be determined. At 1806, one or more surface treatments may be determined to provide a predetermined heat distribution. Steps 1802, 1804, and 1806 may proceed in a substantially similar manner to steps 1702, 1704, and 1706 described above.

At 1808, the determined surface treatment(s) may be applied to one or more sheets. In some implementations, these sheets may be a laminate or other material designed to be applied as a sticker, or label to a surface of the device. In some implementations, the sheets may be part of a cover for the device. In some cases, the thermal properties of the sheet may be considered when determining the surface treatments at 1806.

At 1810, the one or more substrates 502 may be applied to one or more devices that have similar thermal characteristics to the test device. In this way, the thermal properties of a device may be altered after the device has been sold, such as with an after-market enhancement of devices already in use. For example, the one or more substrates 502 may be incorporated into or provided as an accessory device such as a cover which is configured to couple to the device.

Those having ordinary skill in the art will readily recognize that certain steps or operations illustrated in in the figures above can be eliminated, combined, subdivided, executed in parallel, or taken in an alternate order. Moreover, the various elements of the schematics described above are not to scale or proportional to dimensions of elements in implementations. Certain proportions of elements may have been enlarged or reduced to provide for greater clarity in depicting example implementations.

Additionally, those having ordinary skill in the art readily recognize that the techniques described above can be utilized in a variety of devices, environments, and situations. Although the present disclosure is written with respect to specific embodiments and implementations, various changes and modifications may be suggested to one skilled in the art and it is intended that the present disclosure encompass such changes and modifications that fall within the scope of the appended claims.

What is claimed is:

1. A structure comprising:
   a heat source;
   a substrate including a first material having a first thermal conductivity, a first surface facing the heat source, and a second surface distal from the heat source; and
   a second material disposed on the second surface of the substrate, the second material having a second thermal conductivity less than the first thermal conductivity, wherein the second material is distributed on the substrate in a pattern having a first portion thicker than a second portion and one or more of the first material or the second material is arranged to conduct heat away from at least one hot spot associated with the heat source.

2. The structure of claim 1, wherein the first portion is closer to the at least one hot spot than the second portion.

3. The structure of claim 1, wherein the pattern has a thickness that varies such that an amount of heat that diffuses through the second material increases with increasing distance from the at least one hot spot.

4. The structure of claim 1, wherein the second material includes a plurality of substances, each substance having a different thermal resistivity, and wherein the thermal resistivities of the second material provide for diffusion of heat away from the at least one hot spot in a transverse direction relative to the at least one hot spot.

5. A structure comprising:
   a heat source;
   a substrate including a first material having a first thermal conductivity; and
   a second material disposed in a pattern on a surface of the substrate, the pattern having a first portion thicker than a second portion, wherein the second material has a second thermal conductivity that is different from the first thermal conductivity;
   wherein the second material causes diffusion of heat from at least one hot spot associated with the heat source in a transverse direction relative to the at least one hot spot and the first portion causes greater transverse diffusion of heat away from the at least one hot spot than the second portion.

6. The structure of claim 5, wherein a thickness of the pattern varies such that an amount of heat that diffuses through the second material increases with increasing distance from the at least one hot spot.

7. The structure of claim 5, wherein the second material prevents diffusion of at least a portion of the heat through the second material and the first material conducts the at least a portion of the heat in the transverse direction relative to the at least one hot spot.

8. The structure of claim 5, wherein the first portion of the pattern is positioned closer to the at least one hot spot than the second portion of the pattern.

9. The structure of claim 5, wherein the first thermal conductivity is greater than the second thermal conductivity.

10. The structure of claim 5, wherein the substrate includes a first side facing the heat source and a second side distal from the heat source, and wherein the second material is positioned on the second side of the substrate.

11. A structure comprising:
    a heat source;
    a first material having a first thermal conductivity, a first surface facing the heat source, and a second surface distal from the heat source; and
    a second material positioned on the second surface and having a second thermal conductivity that differs from the first thermal conductivity, wherein the second material is arranged to limit conduction of heat in an outward direction from at least one hot spot associated with the heat source and cause the first material to conduct heat in a transverse direction away from the at least one hot spot, and wherein the second material is arranged such that an amount of heat that diffuses through the second material increases with increasing distance from the at least one hot spot.

12. The structure of claim 11, wherein the second material includes a first portion and a second portion and the first portion is thicker than the second portion.

13. The structure of claim 12, wherein the first portion is closer to the at least one hot spot than the second portion.

14. The structure of claim 11, wherein the second material prevents diffusion of at least a portion of the heat through the second material and the first material conducts the at least a portion of the heat in the transverse direction.

15. The structure of claim 11, wherein the second thermal conductivity is less than the first thermal conductivity.

16. The structure of claim 11, wherein the second material includes a generally constant thickness.

17. The structure of claim 11, wherein the second material includes a plurality of substances, each substance having a different thermal resistivity, and wherein the thermal resistivities of the second material provide for diffusion of heat away from the at least one hot spot in the transverse direction relative to the at least one hot spot.

18. The structure of claim 11, wherein the heat source is spaced apart from the first material by a gap.

19. The structure of claim 11, wherein the first material is configured to conduct the heat from the at least one hot spot in a first direction toward the second material, and the second material is configured to limit conduction of the heat in the first direction to cause the first material to conduct the heat in a second direction that is not parallel to the first direction.

20. The structure of claim 11, wherein the second material is arranged on the second surface in a pattern, and the pattern is configured to cause the first material to conduct the heat in the transverse direction away from the at least one hot spot.

* * * * *